US 6,512,416 B2

(12) United States Patent
Burns et al.

(10) Patent No.: US 6,512,416 B2
(45) Date of Patent: Jan. 28, 2003

(54) EXTENDED RANGE VARIABLE GAIN AMPLIFIER

(75) Inventors: Lawrence M. Burns, Laguna Hills; Leonard Dauphinee, Irvine, both of CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/897,601

(22) Filed: Jul. 3, 2001

(65) Prior Publication Data

US 2002/0000880 A1 Jan. 3, 2002

Related U.S. Application Data

(60) Provisional application No. 60/215,850, filed on Jul. 3, 2000, and provisional application No. 60/221,617, filed on Jul. 28, 2000.

(51) Int. Cl.[7] .................................................. H03G 3/20
(52) U.S. Cl. ....................... 330/129; 330/51; 330/124 R
(58) Field of Search .............................. 330/51, 124 R, 330/129, 133, 134, 282, 284

(56) References Cited

U.S. PATENT DOCUMENTS

| 5,077,541 A | 12/1991 | Gilbert ...................... 330/284 |
| 5,432,478 A | 7/1995 | Gilbert ...................... 330/284 |
| 5,684,431 A | 11/1997 | Gilbert et al. ............... 330/254 |
| 6,002,356 A | * 12/1999 | Cooper ....................... 341/159 |
| 6,232,908 B1 | * 5/2001 | Nakaigawa .................. 341/155 |
| 6,255,906 B1 | * 7/2001 | Eidson et al. ........... 330/124 R |
| 6,377,117 B2 | * 4/2002 | Oskowsky et al. ........... 330/51 |

FOREIGN PATENT DOCUMENTS

NL           8203979        5/1984      ............ H03H/7/25

OTHER PUBLICATIONS

Copy of International Search Report from PCT Application No. PCT/US01/21022, filed Jul. 3, 2001, 6 pages (mailed Aug. 28, 2002).
Sam, B., "Direct Conversion Receiver for Wide-band CDMA," Wireless Symposium, pp. 1–5, (Spring 2000).
U.S. patent application Ser. No. 09/438,687, Bult et al., filed Nov. 1999.

* cited by examiner

Primary Examiner—Terry D. Cunningham
Assistant Examiner—Quan Tra
(74) Attorney, Agent, or Firm—Sterne, Kessler, Goldstein & Fox P.L.L.C.

(57) ABSTRACT

An extended range variable gain amplifier is described. The variable gain capability is achieved by replacing differential pair amplifiers having an input signal with less attenuation with one having an input signal that is more attenuated. This replacement continues until only ten differential pair amplifiers are remaining. At this point, if less gain is desired, differential pair amplifiers are turned off, but are not replaced. A minimum number of amplifiers will remain on.

40 Claims, 13 Drawing Sheets

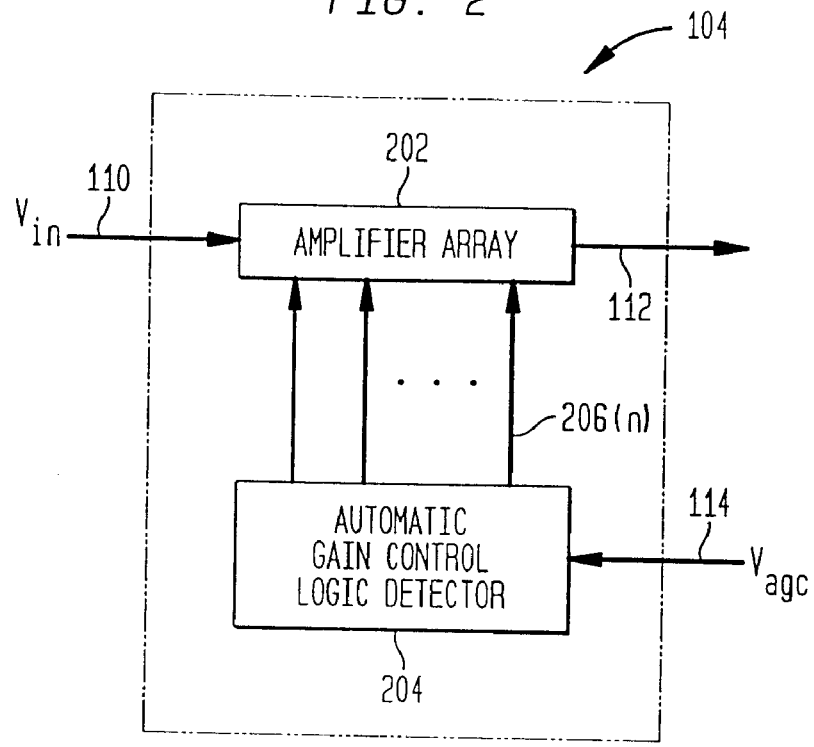
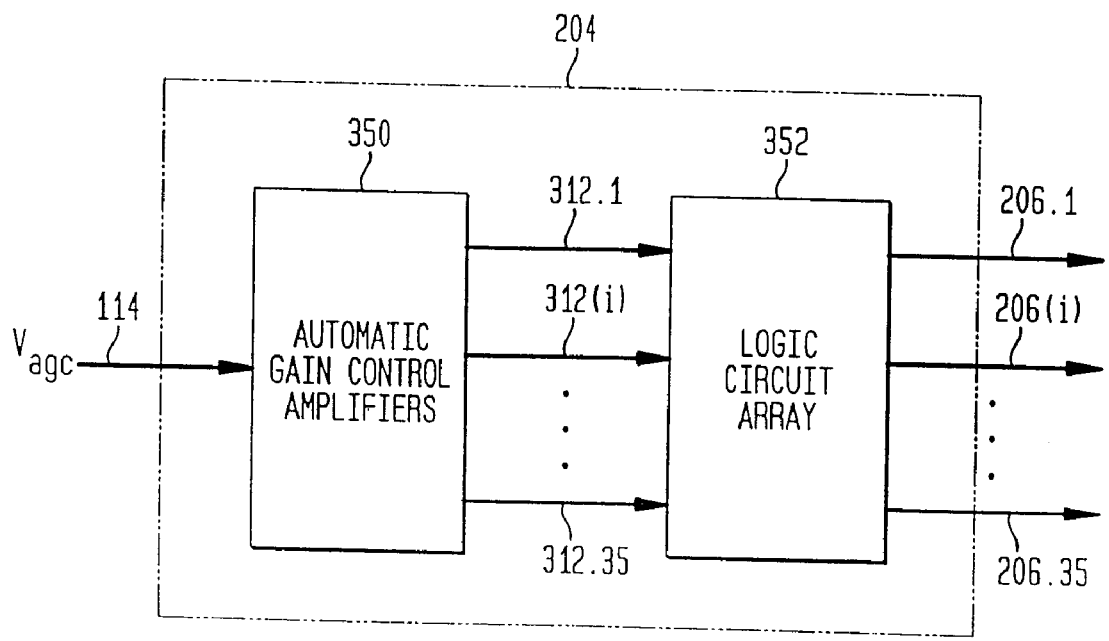

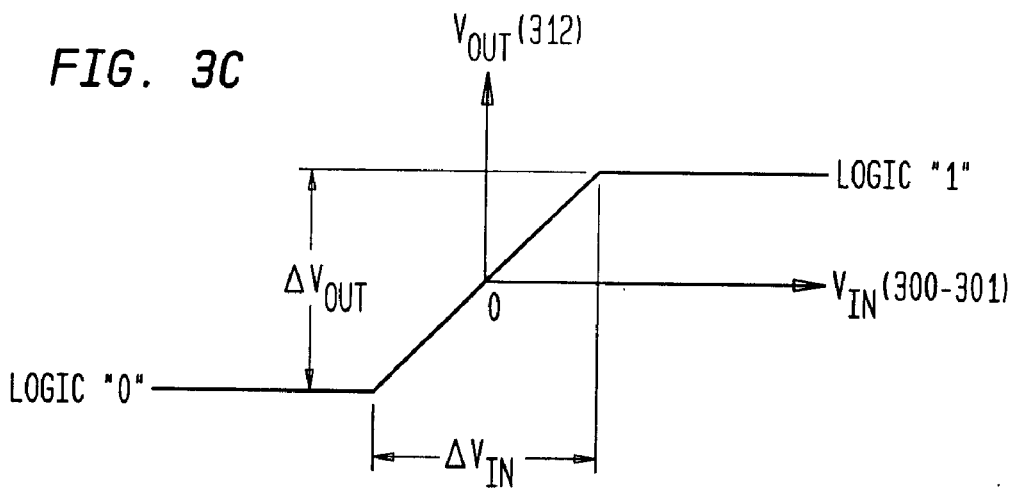
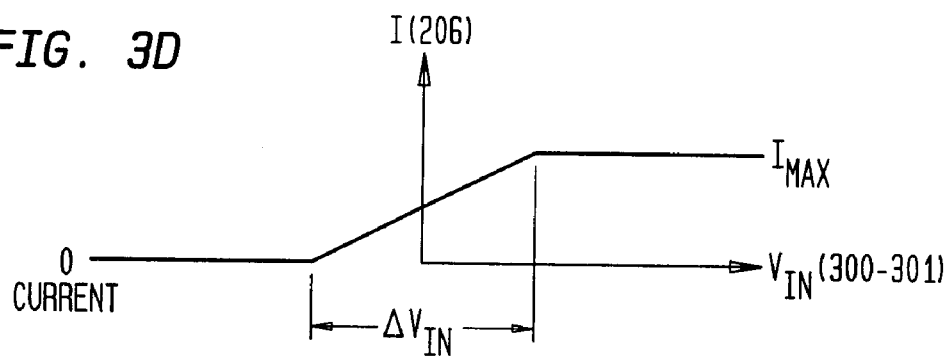
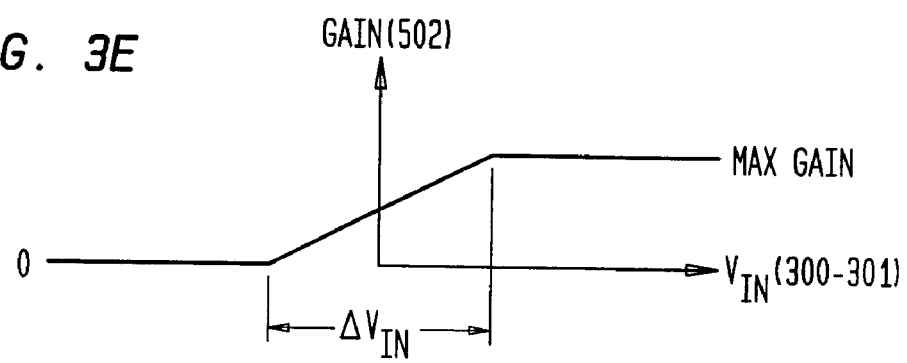

FIG. 7

| NODE | VOLTAGE |
|---|---|
| $V_{dd}$ | 1.14 |
| 301.1 | 1.12 |
| 301.2 | 1.10 |
| 301.3 | 1.08 |
| 301.4 | 1.06 |
| 301.5 | 1.04 |
| 301.6 | 1.02 |
| 301.7 | 1.00 |
| 301.8 | .98 |
| 301.9 | .96 |
| 301.10 | .94 |
| 301.11 | .92 |
| 301.12 | .90 |
| 301.13 | .88 |
| 301.14 | .86 |
| 301.15 | .84 |
| 301.16 | .82 |
| 301.17 | .80 |
| 301.18 | .78 |
| 301.19 | .76 |
| 301.20 | .74 |
| 301.21 | .72 |
| 301.22 | .70 |
| 301.23 | .68 |
| 301.24 | .66 |
| 301.25 | .64 |
| 301.26 | .62 |
| 301.27 | .60 |
| 301.28 | .58 |
| 301.29 | .56 |
| 301.30 | .54 |
| 301.31 | .50 |
| 301.32 | .48 |
| 301.33 | .44 |
| 301.34 | .42 |
| 301.35 | .40 |

EXTENDED RANGE VARIABLE GAIN AMPLIFIER

CROSS-REFERENCE TO OTHER APPLICATIONS

This application claims the benefit of the following: U.S. Provisional Application No. 60/215,850, filed Jul. 3, 2000; and U.S. Provisional Application No. 60/221,617, filed Jul. 28, 2000, both of which are incorporated herein in their entirety.

This application is also related to U.S. Application No. 09/438,687, entitled Integrated Switchless Programmable Attenuator and Low Noise Amplifier, filed on Nov. 12, 1999, and incorporated by reference herein in its entirety.

BACKGROUND OF THE INVENTION

1. Field of the Invention

The invention generally relates to variable gain amplifiers and applications of the same. In an embodiment, the variable gain amplifier is used in a set-top control box for the delivery of cable television service to a customer.

2. Related Art

Variable gain amplifiers are known in the art. What is needed is a more linear, less costly approach to providing variable gain.

SUMMARY OF THE INVENTION

The present invention is a variable gain amplifier having a plurality of differential pair amplifiers that are sequentially switched on and off to provide variable amplification. A similar plurality of logic decoder circuits compares an automatic gain control voltage and generates logic signals to switch certain amplifiers on and off, depending on the amplitude of the automatic gain control voltage. The invention covers the embodiment wherein ten differential pair amplifiers amplify an unattenuated cable TV signal when full amplification is desired. As less amplification is desired, the first amplifiers are switched out and others are switched in, where the newer amplifiers have attenuated inputs. The switching continues until only ten amplifiers remain on. At this point, if less amplification is desired, amplifiers are switched out starting with the least attenuated amplifier, but no replacement amplifiers are switched in. There will always be a minimum number of amplifiers in the circuit. In one embodiment, the minimum number is three.

BRIEF DESCRIPTION OF THE FIGURES

FIG. 2 illustrates an exemplary amplifier array;

FIGS. 3A–3B illustrate an automatic gain control logic decoder;

FIG. 3C illustrates the transfer function of a comparator;

FIG. 3D illustrates the transfer function of an amplifier control current;

FIG. 3E illustrates transfer function of the gain of an amplifier in the amplifier array;

FIG. 7 illustrates a set of exemplary voltages for nodes in the automatic gain control logic decoder of FIG. 3;

DETAILED DESCRIPTION OF THE PREFERRED EMBODIMENTS

In a Community Antenna Television (CATV) system (also referred to as cable TV), a plurality of signals are frequency division multiplexed onto one or more coaxial cables. The CATV system has a downstream band (headend-to-user) and an upstream band (user-to-headend). In the downstream band, there are approximately 135 channels having frequencies that range from 50 MHz to 860 MHz. The individual down-stream channels represent different television signals that can be a mixture of analog television signals and digital television signals. The analog television signals are preferably NTSC or PAL compliant television signals. The digital televison signals carry digital video or cable modem data (e.g. internet traffic), and are modulated using 64 QAM or 256 QAM. In the upstream band, the frequency range covers from 5–42 MHz in the United States and 5–65 MHz in Europe. The digital upstream signals carry cable modem data (e.g. internet traffic).

While the amplitude of each signal varies as a function of the information being transmitted on that channel, the amplitude of the combined signal on the cable will vary not only as a function of the amplitude of each of the individual signals, but also as a function of the phase and amplitude relationship of each channel with respect to the others. Thus, the overall amplitude of the signal will be time varying as the phase and amplitude of each of the individual signals line up. As an example, the amplifier has to have good distortion performance when 135 channels, each at 0 dBmV, are fed to its input. When the input level is increased to +15 dBmV on each channel, the amplifier must attenuate the input level back down to the same output level as in the case when all channels were at 0 dBmV, while maintaining good distortion performance.

Figure 1:
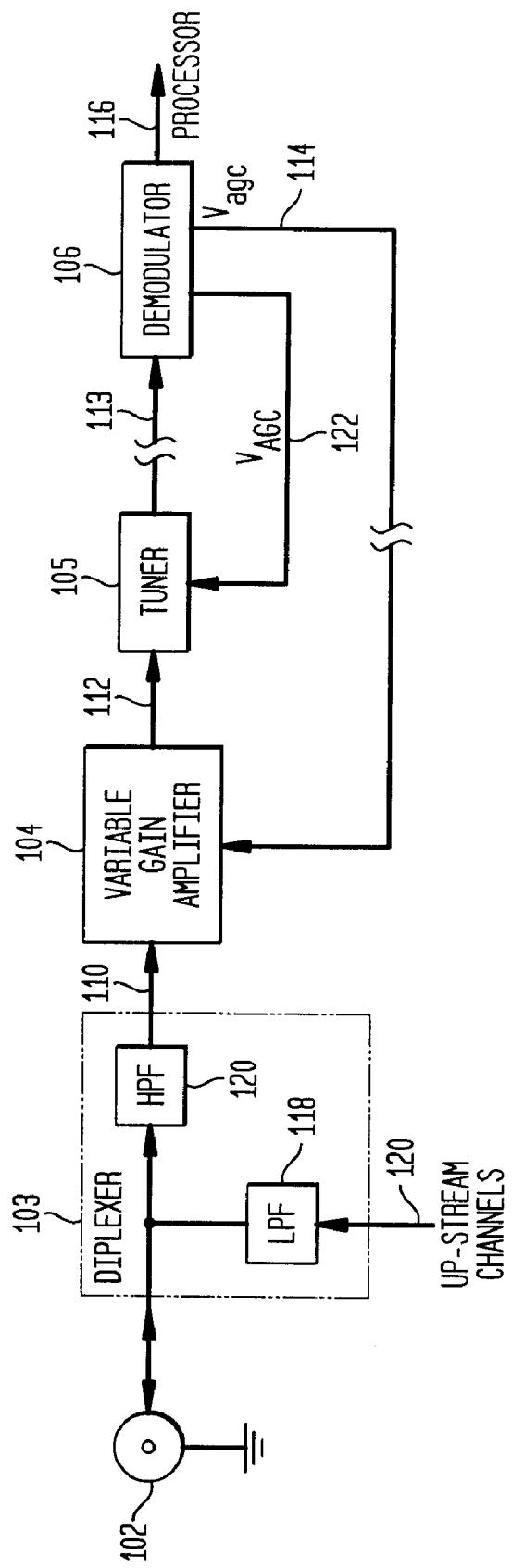
FIG. 1 illustrates an exemplary community antenna (i.e. cable) television architecture.

Looking to FIG. 1, an exemplary CATV architecture is shown. CATV cable 102 is shown connected to a diplexer 103. The diplexer 103 includes a lowpass filter 118 and a highpass filter 120. The lowpass filter 118 has a passband that is sufficient to pass upstream channels 118 to the cable 102, where the upstream channels cover from 5–42 MHz for the U.S. and Canada and from 5–65 MHz for Europe. The highpass filter 120 has a passband that is sufficient to pass the downstream channels 110 from the cable 102 to a variable gain amplifier (VGA) 104, where the downstream channels cover from 54–860 MHz in the US and Canada. Concentrating on the down-stream, the output of VGA 104 is an amplified signal 112 that is routed to a tuner 105. The tuner 105 includes at least one bandpass filter that selects a single down-stream channel 113 having a 6 MHz bandwidth. In embodiments, the selected channel 113 is centered at 44 MHz. The selected channel 113 is then routed to a demodulator 106, which outputs a demodulated signal 116 for further processing before being sent to a user device (e.g. television set or computer). For example, the demodulate signal 116 can be digital video or cable modem data. The demodulator 106 also analyzes the power of the down-converted channel 113 and outputs an automatic gain control (AGC) voltage 114 and an AGC voltage 122. The AGC voltage 114 controls the variable amplifier 104 and the AGC voltage 122 controls an amplifier in the tuner 105.

The division of AGC tuning responsibility in FIG. 1 is further explained as follows. Preferably, as long as the power of the down-converted channel 113 is below a threshold level, the AGC 114 is set so that the amplifier 104 is at maximum gain, and the AGC 122 adjusts the gain of in tuner 105 to provide AGC control. Once the power of the down-converted channel 113 rises above the threshold, then the AGC 114 begins reducing gain of the amplifier 104. An advantage of this tuning hierarchy is that the amplifier 104 is preferably a low noise amplifier, and therefore maximum signal-to-noise ratio is achieved by operating the amplifier 104 at maximum gain for as long as possible before reducing its gain for AGC.

In FIG. 2, VGA 104 is illustrated. VGA 104 is shown as comprising an amplifier array 202 and an automatic gain control logic decoder 204. Automatic gain control logic decoder 204 receives automatic gain control voltage 114. Automatic gain control voltage 114 provides feedback as to the amplitude of the demodulated signal. Automatic gain control logic decoder 204 will process automatic gain control voltage 114 according to the method described below, and will output a plurality of amplifier control signals 206(n) to amplifier array 202. As seen in FIG. 2, amplifier array 202 receives cable TV signal 110 and amplifier control signals 206(n), and outputs amplified signal 112.

In an embodiment of the invention, amplifier array 202 is comprised of thirty-five gain stages. In one implementation, each gain stage is a differential pair amplifier. In an alternate embodiment, amplifier array 202 is comprised of more than thirty-five gain stages. In yet another embodiment, amplifier array 202 is comprised of less than thirty-five gain stages. In an alternate implementation, each gain stage is an amplifier other than a differential pair amplifier. The amplifiers used in the circuit are preferably semiconductor devices. As an example, and not meant to be limiting, the amplifiers include metal oxide semiconductor field effect transistors (MOSFETs). For purpose of illustration, and not meant to be limiting, the invention will now be described for the embodiment wherein there are thirty-five gain stages.

Figure 3B:
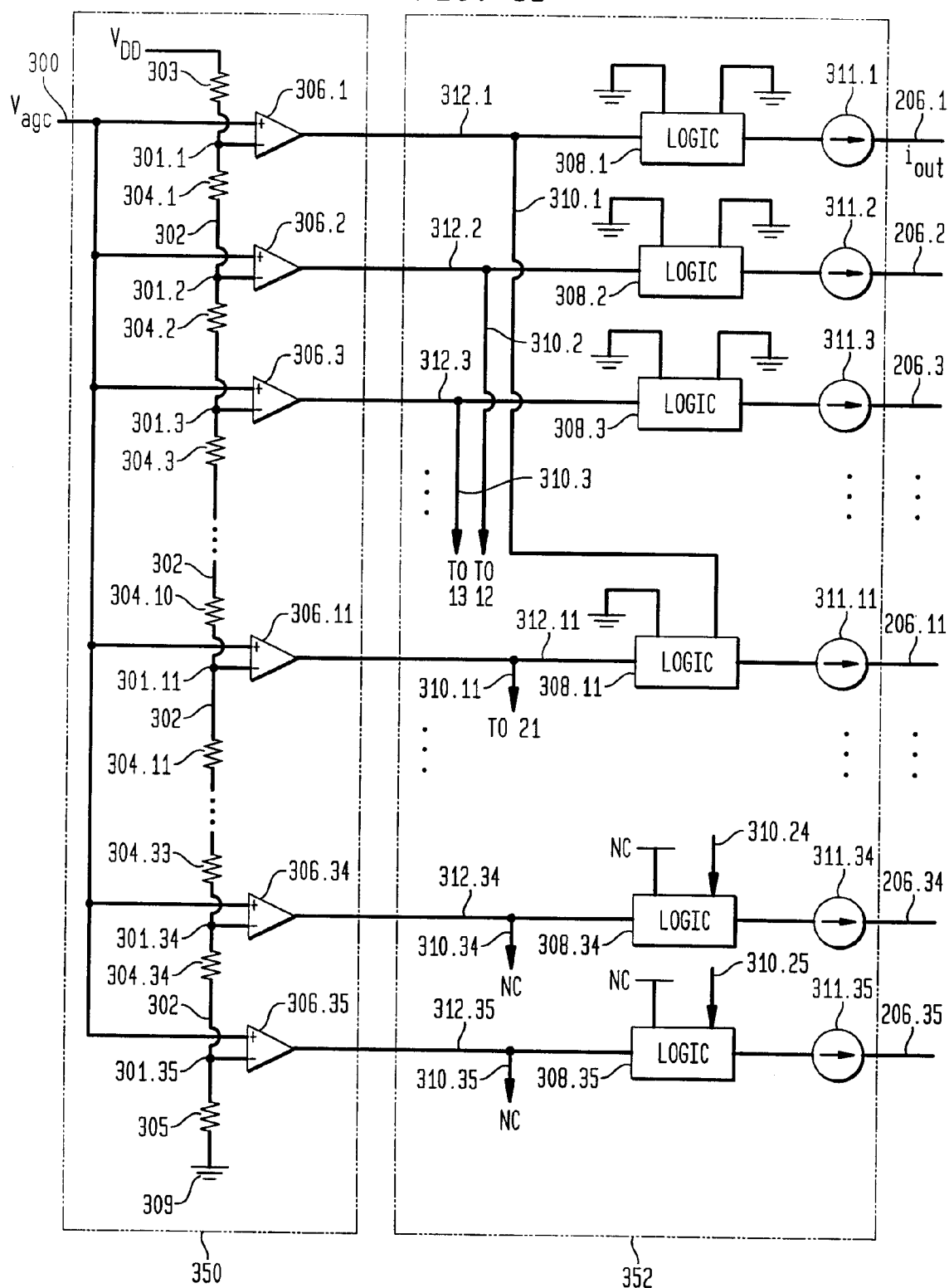

Looking now to FIG. 3A, automatic gain control logic decoder 204 is illustrated as comprising automatic gain control amplifiers 350 and a logic circuit array 352. Automatic gain control amplifiers 350 accept automatic gain control voltage 114 and output a plurality of comparator outputs 312(n) which are routed to logic circuit array 352. Logic circuit array 352 outputs the plurality of amplifier control signals. As illustrated in FIG. 3B, automatic gain control amplifiers 350 are preferably comprised of a resistor ladder 302 and thirty-five high-gain, low frequency amplifiers 306.1 through 306.35, and logic circuit array 352 is preferably comprised of thirty-five logic circuits 308.1 through 308.35. Resistor ladder 302 is comprised of a top resistor 303, thirty-four resistors designated as resistors 304.1 through 304.34, and a bottom resistor 305. Top resistor 303 is connected on a first side to a bias potential $V_{DD}$ and on a second side to a first side of resistor 304.1. The connection point between top resistor 303 and resistor 304.1 is node 301.1. A second side of resistor 304.1 is connected to a first side of resistor 304.2 at a node 301.2. Thus it can be said that for any sequential pair of resistors 304(i) and 304(i+1) in resistor ladder 302, a second side of resistor 304(i) is connected to a first side of resistor 304(i+1) at node 301(i+1). At the "bottom" of resistor ladder 302, a second side of resistor 304.34 is preferably connected to a first side of bottom resistor 305 at node 301.35, and a second side of bottom resistor 305 is preferably connected to a ground 309. Those skilled in the relevant art(s) will understand, based on the teachings contained herein, that the second side of bottom resistor 305 could be connected to a potential other than ground without deviating from the spirit and intent of the invention. Further, the invention also covers the embodiment wherein the first side of resistor 304.1 is connected directly to bias potential $V_{DD}$ 307, and the second side of resistor 304.34 is connected directly to ground 309.

In a preferred embodiment, node 301.1 through node 301.35, inclusive, are connected to an input of high-gain, low frequency amplifier 306.1 through high-gain, low frequency amplifier 306.35, respectively.

Figure 8:
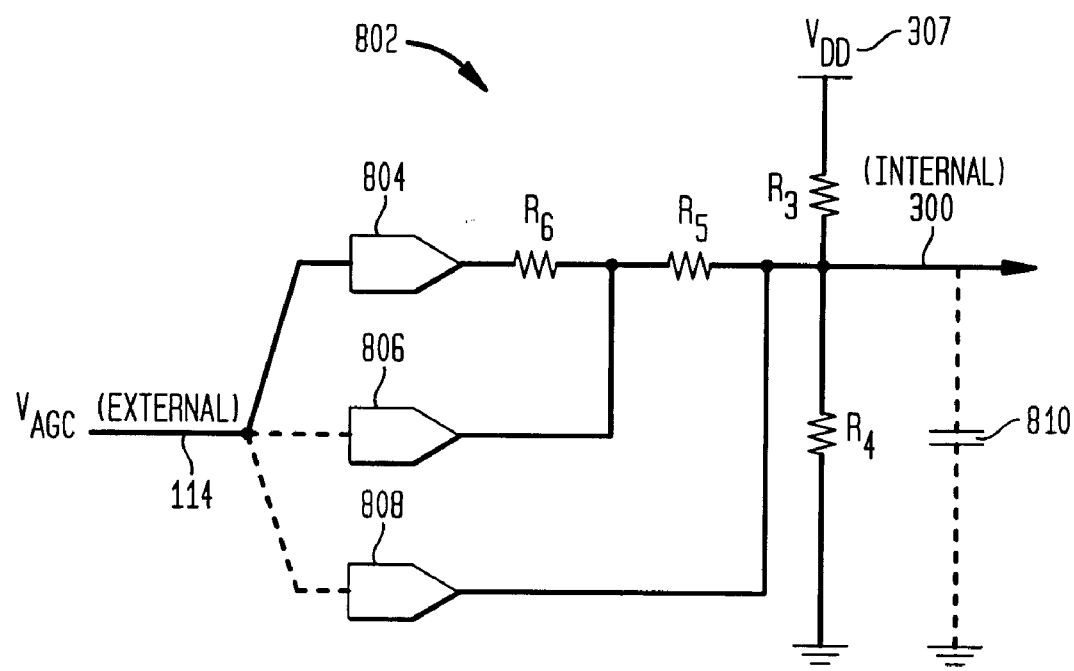
FIG. 8 illustrates a voltage divider for different sensitivities.

High-gain, low frequency amplifier 306.1 accepts an (internal) automatic gain control voltage 300 at its "positive" input, and the scaled voltage from node 301.1 at its "negative" input. Internal AGC voltage 300 is derived from (external) AGC voltage 114 as illustrated in FIG. 8, which is described in further detail herein. High-gain, low frequency amplifier 306.1 produces a comparator output 312.1. Comparator output 312.1 will be a logic "1" or a logic "0" depending on whether the voltage at the "positive" input of high-gain, low frequency amplifier 306.1 (i.e., automatic gain control voltage 300) is above or below the voltage at the "negative" input (i.e., the scaled voltage at node 301.1). Similarly, high-gain, low frequency amplifier 306.2 accepts automatic gain control voltage 300 at its "positive" input, and the scaled voltage from node 301.2 at its "negative" input. High-gain, low frequency amplifier 306.2 produces a comparator output 312.2. Comparator output 312.2 will be a logic "1" or a logic "0" depending on whether the voltage at the "positive" input of high-gain, low frequency amplifier 306.2 (i.e., automatic gain control voltage 300) is above or below the voltage at the "negative" input (i.e., the scaled voltage at node 301.2). This pattern continues through high-gain, low frequency amplifier 306.35. Thus, comparator outputs 312.1 through 312.35, inclusive, may be logic "1" or logic "0." Those skilled in the relevant art(s) will appreciate, based on the teachings contained herein, that the polarities of the voltages can be reversed and still fall within the spirit and intent of the invention. As an example (as described herein for illustrative purposes), automatic gain control voltage 300 may decrease as the signal strength of amplified signal 112 increases, or, alternatively, it may increase as the signal strength of amplified signal 112 increases. This polarity adjustment can be accommodated through the use of any number of circuit configurations, such as inverters.

Each comparator 312 operates as a linear amplifier over a small $\Delta V_{IN}$ as illustrated in FIG. 3C. Referring to FIG. 3C, $V_{IN}$ represents the difference between the positive and negative inputs of a comparator 312, and $V_{OUT}$ represents the output of comparator 312. Over a small range of $\Delta V_{IN}$ (e.g. approximately 10 mV), $\Delta V_{OUT}$ is linear. Outside of this small $\Delta V_{IN}$ range, Vout saturates to a logic "0" or a logic "1" as shown. In other words, the comparators 312 may be described as limiting amplifiers, as will be understood by those skilled in the arts. The linear operation over $\Delta V_{IN}$ provide smoothness in AGC performance and prevents bit errors in the demodulator 106. More specifically, the linear operation prevents a very small change in $V_{IN}$ (e.g. 1 mV) from turning off a first set of amplifiers, and turning on a second set of amplifiers, which may cause an abrupt change in signal amplitude to the demodulator 106.

Furthermore, in embodiments of the invention, the comparators 312 are an open-loop, non-clocked comparators.

Comparator outputs 312.1 through 312.35 are connected to a first input of logic circuits 308.1 through 308.35, respectively. The function of logic circuits 308(n) will be explained below with reference to FIG. 4A through FIG. 4D. Each of logic circuits 308.1 through 308.10 are also connected to ground at a second and a third input. Each of logic circuits 308.11 through 308.35 are connected to a shifting signal 310.1 through 310.25, respectively, at a second input. Each of logic circuits 308.11 through 308.32 are further connected to ground at a third input, and each of logic circuits 308.33 through 308.35 have a third input not connected. Logic circuits 308.1 through 308.35 control current sources 311.1 through 311.35 to produce output amplifier control signals 206.1 through 206.35, respectively. As described above, amplifier control signals 206(n) are routed to amplifier array 202(n).

The current sources 311 (and corresponding logic circuits 308) are adapted to produce currents 206 in accordance with limiting amplifier feature of the comparators 306 that was described above. For example, as shown in FIG. 3D, if $V_{IN}$ for a comparator 306 is within the $\Delta V_{IN}$, then the current 206 changes in a smooth or linear fashion. Outside $\Delta V_{IN}$ the current 206 saturates to a maximum value ($I_{MAX}$) or the current value is 0, as is shown. In embodiments, the current sources 206 are adapted so $I_{MAX}$ is 625 $\mu$A, and so that the current at $V_{IN}$=0 volts is $I_{MAX}/2$, or 312.5 $\mu$A.

As can be seen in FIG. 3B, shifting signal 310.1 is an input to logic circuit 308.11, and shifting signal 310.2 is an input to logic circuit 308.12. Similarly, any shifting signal 310(i) is an input to logic circuit 308(i+10), for "i" between 1 and 25, inclusive. Shifting signal 310.26 through shifting signal 310.35, inclusive, are not connected.

FIG. 4A through FIG. 4D depict equivalent gate representations of logic circuits 308(n). In this exemplary implementation, all logic circuits 308(n) are seen to have the same equivalent gate representations. The standard configuration for any logic circuit 308(i) includes an inverter 402, an AND gate 406, an OR gate 404, and a resistor 408. Inverter 402 receives an input from node B and outputs a shifting control signal 410. AND gate 406 receives shifting control signal 410 at its first port and an automatic gain control (AGC) control signal 412 at its second port. The output port of AND gate 406 outputs amplifier control signal 206(i). OR gate 404 receives an input from node C at its first port and comparator output 312(i) from node A at its second port. The output port of OR gate 404 outputs AGC control signal 412.

Figure 4A:
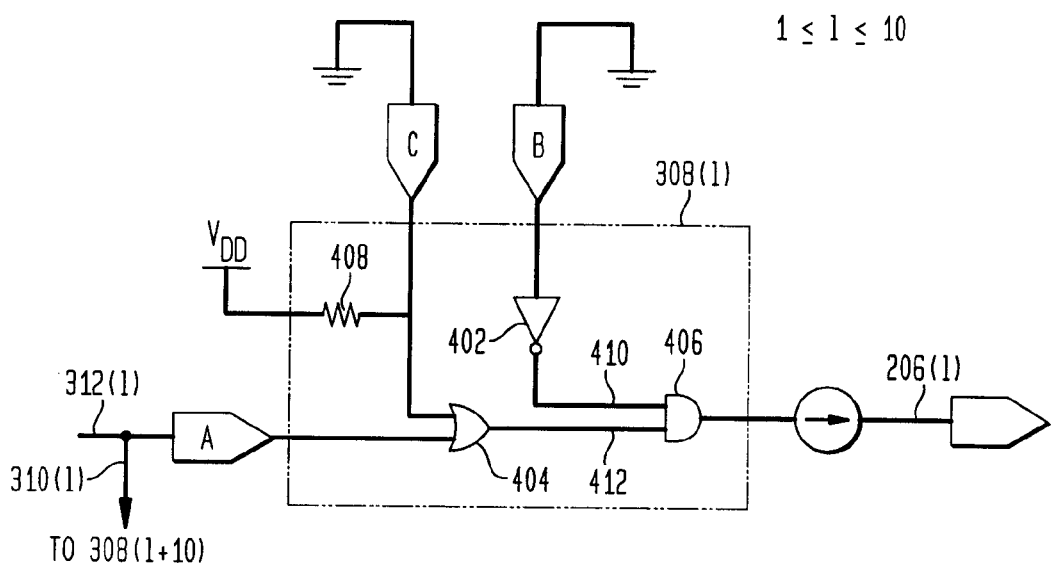
FIGS. 4A–4D depict equivalent gate representations of logic circuits.
Figure 4B:
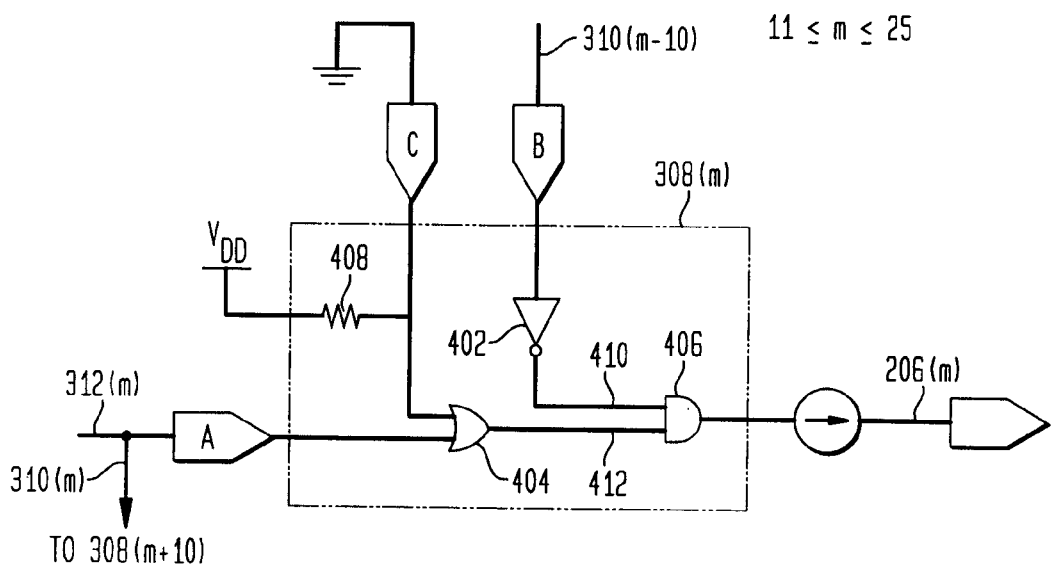
Figure 4C:
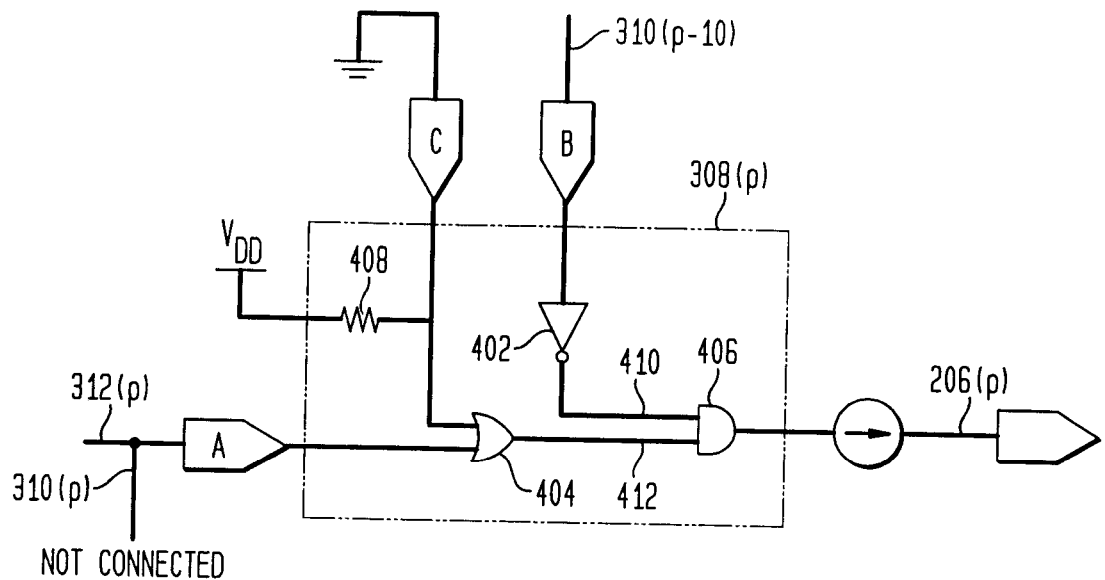
Figure 4D:
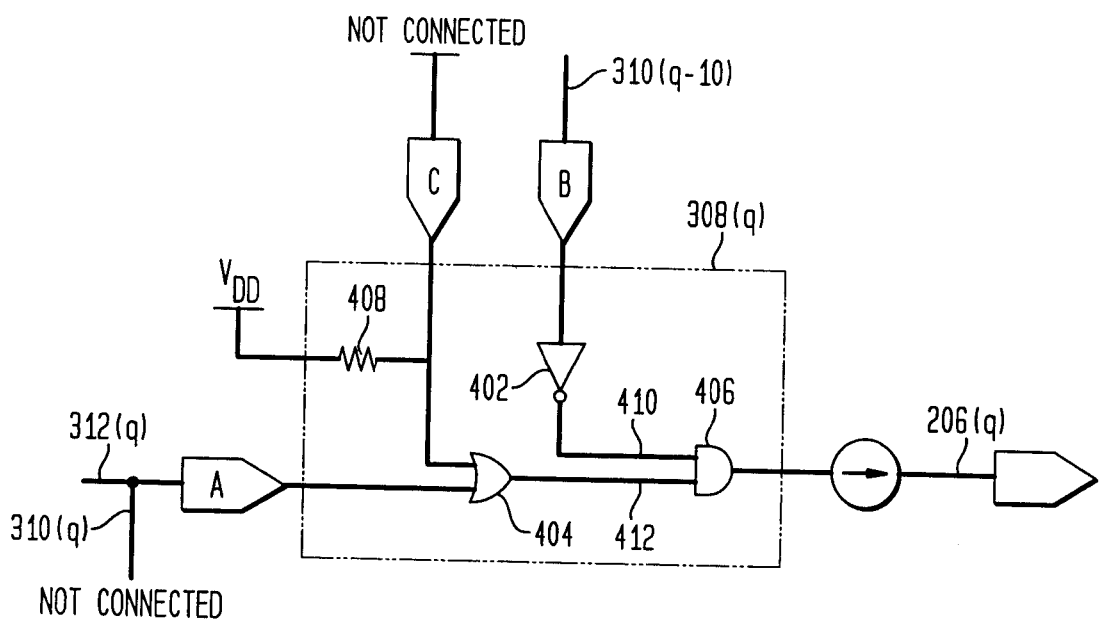

FIG. 4A depicts the equivalent gate representation for logic circuits 308.1 through 308.10, inclusive. FIG. 4B depicts the equivalent gate representation for logic circuits 308.11 through 308.25, inclusive. FIG. 4C depicts the equivalent gate representation for logic circuits 308.26 through 308.32, inclusive. FIG. 4D depicts the equivalent gate representation for logic circuits 308.33 through 308.35, inclusive.

Looking first to FIG. 4A, it can be seen that a ground is connected to node B. Thus, inverter 402 has a grounded input and shifting control signal 410 will always be a logic "1." AGC control signal 412 is determined by comparator output 312(l) from high-gain, low frequency amplifier 306 (l). Referring back to FIG. 3B, if automatic gain control voltage 300 is higher than the scaled voltage at node 301(l), comparator output 312(l) will be a logic "1." Thus, OR gate 404 will receive a logic "1" at its second port and a logic "0" at its first port, as node C is grounded. Consequently, AGC control signal 412 will be a logic "1." As a result, AND gate 406 will have two logic "1" inputs resulting in amplifier control signal 206(l) being a logic "1." Again referring back to FIG. 3B, if automatic gain control voltage 300 is lower than the scaled voltage at node 301(l), comparator output 312(l) will be a logic "0." Thus, OR gate 404 will receive a logic "0" at its second port and a logic "0" at its first port, as node C is grounded. Consequently, AGC control signal 412 will be a logic "0." As a result, AND gate 406 will have a logic "1" at its first port and a logic "0" at its second port, resulting in amplifier control signal 206(l) being a logic "0." Looking further at FIG. 4A, it is seen that comparator output 312(l) is routed to logic circuit 308(l+10) as shifting signal 310(l).

Looking now to FIG. 4B, it can be seen that shifting signal 310(m−10) is connected to node B and is input to inverter 402. If shifting signal 310(m−10) is a logic "1," shifting control signal 410 will be a logic "0," and if shifting signal 310(m−10) is a logic "0," shifting control signal 410 will be a logic "1." Since OR gate 404 receives a logic "0" at its first port from node C, AGC control signal 412 will be determined solely by comparator output 312(m). Referring back to FIG. 3B, if automatic gain control voltage 300 is higher than the scaled voltage at node 301(m), comparator output 312(m) will be a logic "." Thus, OR gate 404 will receive a logic "1" at its second port and a logic "0" at its first port, as node C is grounded. Consequently, AGC control signal 412 will be a logic "1." If shifting signal 310(m−10) is a logic "1," AND gate 406 will receive a logic "0" at its first port and a logic "1" at its second port, resulting in amplifier control signal 206(m) being a logic "0." If shifting signal 310(m−10) is a logic "0," AND gate 406 will receive a logic "1" at its first port and a logic "1" at its second port, resulting in amplifier control signal 206(m) being a logic "1." Again referring back to FIG. 3B, if automatic gain control voltage 300 is lower than the scaled voltage at node 301(m), comparator output 312(m) will be a logic "." Thus, OR gate 404 will receive a logic "0" at its second port and a logic "0" at its first port, as node C is grounded. Consequently, AGC control signal 412 will be a logic "0." As a result, AND gate 406 will have a logic "0" at its second port, and, regardless what is received at its first port, amplifier control signal 206(m) will be a logic "0." Looking further at FIG. 4B, it is seen that comparator output 312(m) is routed to logic circuit 308(m+10) as shifting signal 310(m).

Looking now to FIG. 4C, it can be seen that shifting signal 310(p−10) is connected to node B and is input to inverter 402. If shifting signal 310(p−10) is a logic "1," shifting control signal 410 will be a logic "0," and if shifting signal 310(p−10) is a logic "0," shifting control signal 410 will be a logic "1." Since OR gate 404 receives a logic "0" at its first port from node C, AGC control signal 412 will be determined solely by comparator output 312(p). Referring back to FIG. 3B, if automatic gain control voltage 300 is higher than the scaled voltage at node 301(p), comparator output 312(p) will be a logic "1." Thus, OR gate 404 will receive a logic "1" at its second port and a logic "0" at its first port, as node C is grounded. Consequently, AGC control signal 412 will be a logic "1." If shifting signal 310(p−10) is a logic "1," AND gate 406 will receive a logic "0" at its first port and a logic "1" at its second port, resulting in amplifier control signal 206(p) being a logic "0." If shifting signal 310(p−10) is a logic "0," AND gate 406 will receive a logic "1" at its first port and a logic "1" at its second port, resulting in amplifier control signal 206(p) being a logic "1." Again referring back to FIG. 3B, if automatic gain control voltage 300 is lower than the scaled voltage at node 301(p), comparator output 312(p) will be a logic "0." Thus, OR gate 404 will receive a logic "0" at its second port and a logic "0" at its first port, as node C is grounded. Consequently, AGC control signal 412 will be a logic "0." As a result, AND gate 406 will have a logic "0" at its second port, and, regardless what is received at its first port, amplifier control signal 206(p) will be a logic "0." Looking further at FIG. 4C, it is seen that shifting signal 310(p), which emanates from comparator output 312(p), is not connected to any logic circuit.

Looking now to FIG. 4D, it can be seen that shifting signal 310(q–10) is connected to node B and is input to inverter 402. If shifting signal 310(q–10) is a logic "1," shifting control signal 410 will be a logic "0," and if shifting signal 310(q–10) is a logic "0," shifting control signal 410 will be a logic "1." Since node C is not connected, the effect of $V_{DD}$ connected through resistor 408 is to cause OR gate 404 to receive a logic "1" at its first port. (Alternatively, node C could be connected to directly to $V_D$, directly). Consequently, AGC control signal 412 will be a logic "1" regardless of the state of comparator output 312(q). Looking back to FIG. 3B, even if automatic gain control voltage 300 is lower than the scaled voltage at node 301(q), thereby resulting in comparator output 312(q) being a logic "0," since OR gate 404 receives a logic "1" at its first port from node C, AGC control signal 412 will always be a logic "1." If shifting signal 310(q–10) is a logic "1," AND gate 406 will receive a logic "0" at its first port and a logic "1" at its second port, resulting in amplifier control signal 206(q) being a logic "0." If shifting signal 310(q–10) is a logic "0," AND gate 406 will receive a logic "1" at its first port and a logic "1" at its second port, resulting in amplifier control signal 206(q) being a logic "1." Looking further at FIG. 4D, it is seen that shifting signal 310(q), which emanates from comparator output 312(q), is not connected to any logic circuit.

Figure 5:
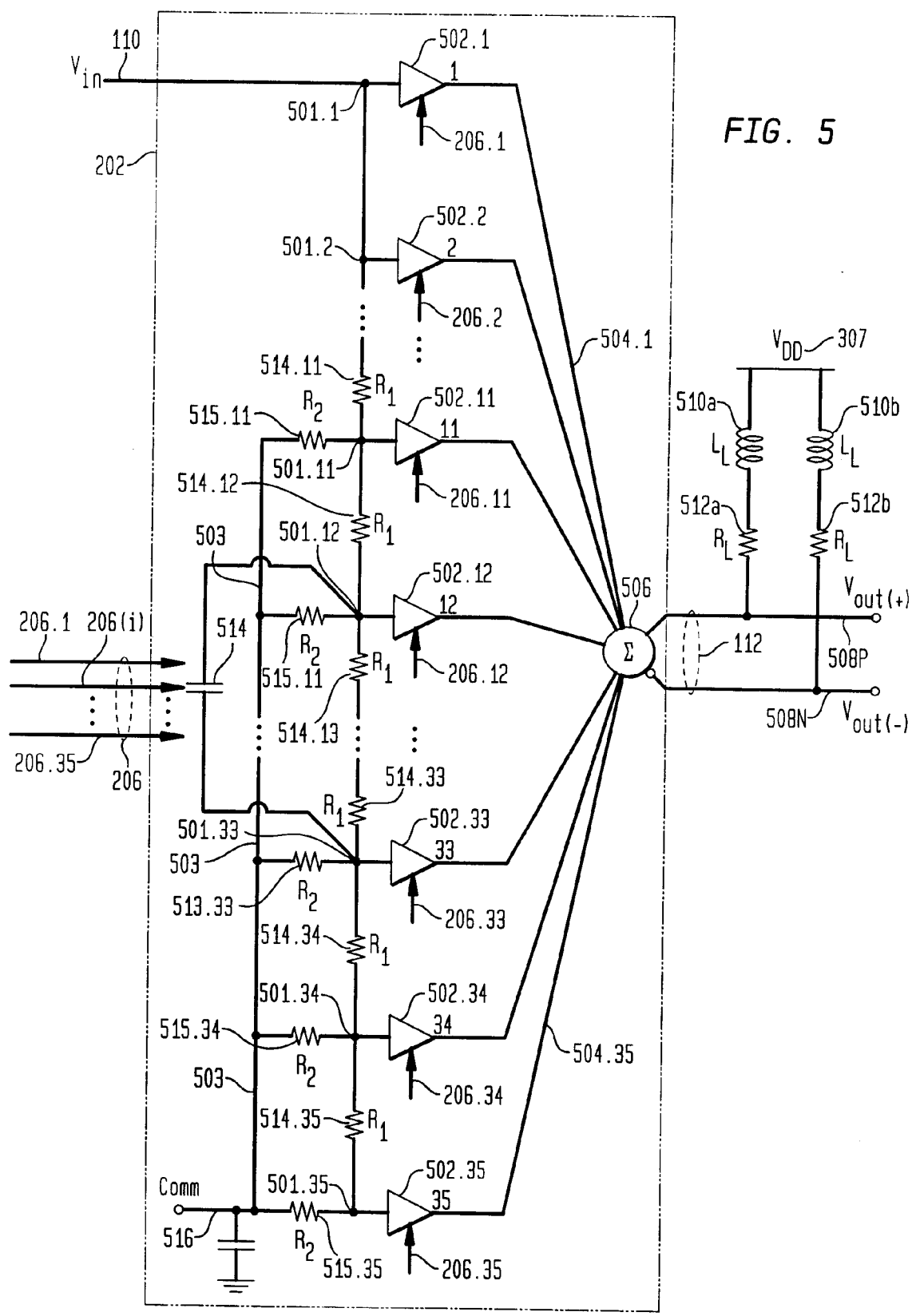
FIG. 5 illustrates an amplifier array according to the present invention.

Looking back to FIG. 2, it is seen that automatic gain control logic decoder 204 outputs amplifier control signals 206(n) to amplifier array 202. The structure and operation of amplifier array 202 is illustrated in FIG. 5. Amplifier assembly 202 is comprised of thirty-five amplifier circuit assemblies 502.1 through 502.35, an amplifier resistor ladder 503 and a summer 506. Amplifier resistor ladder 503 is comprised of input series resistors 514.11 through 514.35 and input shunt resistors 515.11 through 515.35, in substantially the configuration shown in FIG. 5. Those skilled in the relevant art(s) will appreciate, based on the teachings contained herein, that other configurations of resistor ladder may be used to achieve a desired attenuation of cable TV signal 110. Amplifier circuit assemblies 502.1 through 502.10 accept an input signal $V_{in}$ at amplifier input nodes 501.1 through 501.10, respectively. In this implementation, $V_{in}$ is shown to be cable TV signal 110. Amplifier circuit assemblies 502.11 through 502.35 accept input signal from amplifier input nodes 501.11 through 501.35, respectively. Because of amplifier resistor ladder 503, the signals at amplifier input nodes 501.11 through 501.35 are attenuated signals. That is, the amplitude of the signal at amplifier input node 501.11 is less than the amplitude of the signal at amplifier input node 501.10 (recall that the amplitude of the signal at amplifier input node 501.10 is the unattenuated signal, $V_{in}$) and the amplitude of the signal at amplifier input node 501.12 is less than the amplitude of the signal at amplifier input node 501.11. It can be said the amplitude of the signal at any amplifier input node 501(n) is less than the amplitude of the signal at amplifier input node 501(n–1), for n between 11 and 35, inclusive.

Summer 506 can simply be a wire-OR, so that the differential outputs of amplifiers 502.1 through 502.35 are tied together.

Amplifier circuit assemblies 502.1 through 502.35 accept amplifier control signals 206.1 through 206.35, respectively. Any amplifier control signal 206(n) controls corresponding amplifier circuit assembly 502(n) turn "on" or "off" depending on the logic as described above with respect to automatic gain control logic decoder 204. More specifically, the amplifier circuit assembly 502(n) smoothly turns "on" or "off" as shown in FIG. 3E, in accordance with the current 206 (FIG. 3D). As shown in FIG. 3E, during the linear region $\Delta V_{IN}$, the amplifier operates in a linear and smooth fashion. But outside the linear region, the amplifier gain is either at maximum (i.e. completely "on") or the amplifier gain is 0 (completely "off"). More specifically, the amplifier is at maximum gain when control current 206 is at maximum current. The amplifier is at 0 gain when the control current is at 0. When the control current is $I_{MAX}/2$, the amplifier gain for is approximately ½ of the maximum gain.

Amplifier circuit assemblies 502.1 through 502.35 route differential amplifier current outputs 504.1 through 504.35, respectively, to summer 506. The output of summer 506 is amplified signal 112, which is comprised of a positive amplified signal 508P (shown as amplified signal $V_{out}(+)$) and a negative amplified signal 508N (shown as amplified signal $V_{out}(-)$). Positive amplified signal 508P is connected through an on-chip load resistor 512a and an on-chip spiral inductor 510a to bias potential $V_{DD}$ 307. Negative amplified signal 508N is connected through an on-chip load resistor 512b and an on-chip spiral inductor 510b to bias potential $V_{DD}$ 307. The spirals 510 are for primarily for gain enhancement. The spirals 510 can be omitted if a faster IC process is used. It is noted the outputs of the amplifiers 502 are differential currents, which are converted to differential voltage (after being summed) by the resistors 512 and inductors 510.

The outputs of all the gain stages are summed together and connected to $V_{DD}$ through high-value off-chip inductors or ferrite beads (parallel L-R circuits) (not shown in FIG. 5). This provides a greater drain-source voltage to help reduce distortion. Each gain stage runs at a nominal tail current of 10 mA. With 10 stages on, a total current of 100 mA flows in the output (i.e. 50 mA on each line). If one, or both, of the pull-up inductors or beads should not be connected, excessive current can flow in the circuit, possibly causing damage to the on-chip spiral inductors 510a, 510b and load resistors 512a, 512b. To ensure that excessive current does not flow under these conditions, a resistive pull-up circuit is used to shunt away excess current and reduce any peak currents to 1.5 times the continuous metal migration current rating.

Figure 6:
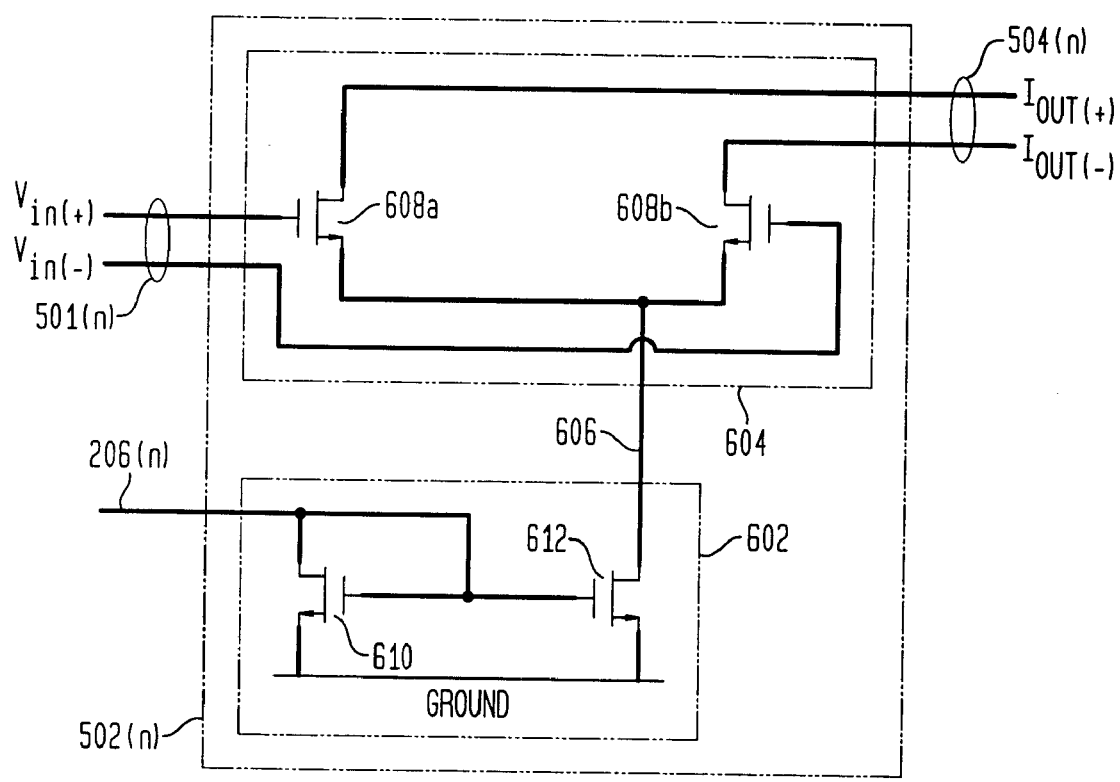
FIG. 6 illustrates a typical differential pair amplifier including an exemplary current mirror.

FIG. 6 illustrates a typical amplifier circuit assembly 502(n) of amplifier array 202. Amplifier control signal 206(n) is routed to a current mirror 602. A current mirror output 606 is then routed to a differential pair amplifier 604, shown in FIG. 6 as a pair of metal-oxide-semiconductor field-effect transistors (MOSFET) 608a and 608b. Those skilled in the relevant art(s) will understand, based on the teachings contained herein, that other differential pair amplifiers, such as, without limitation, those using gallium arsenide field-effect transistors (GaAsFET) or junction field-effect transistors (JFET), may also be used, and are covered by the scope and intent of the invention described herein. Current mirror output 606 is connected to the source of transistor 608a and to the source of transistor 608b. The gate of transistor 608a and the gate of transistor 608b are connected to amplifier input node 501(n). The DC bias voltage 501(n) for the transistors 608a and 608b is set by an internal voltage divider. As shown in FIG. 6, amplifier input node comprises a positive $V_{in}$ and a negative $V_{in}$. The drain of transistor 608*a* generates an output current $I_{out}(-)$ and the drain of transistor 608*b* generates an output current $I_{out}(+)$ which together form differential pair amplifier output current 504(*n*).

The current mirror 602 includes a diode-connected transistor 610 and a transistor 612, where the drain current of transistor 612 generates the current 606 for the circuit 604. Preferably, the transistor 612 is sized larger than the transistor 610 so as to minimize the necessary current that is required from input 206(*n*). For example, an exemplary size ratio is 16:1, so that transistor 612 is 16× larger than transistor 610. Therefore, 625 µA are on input 206(*n*) will produce 10 mA of current 606.

An exemplary operation of VGA 104 in will now be described with reference to FIGS. 2, 3A–3B, 4A–4D, 5, and 6. For purposes of illustration, and not of limitation, FIG. 7 provides exemplary voltages for nodes 301.1 through 301. 35 on the resistor ladder for a circuit having a bias potential $V_{DD}$. As shown in FIG. 7, the resister ladder voltages range from 1.140 volts at the top of the resistor ladder to 0.4 volts at the bottom of the resistor ladder. Consider an initial condition wherein automatic gain control voltage 300 is at its maximum, e.g., slightly above 1.14 volts. In this example, high-gain, low frequency amplifier 306.1 has (slightly greater than) 1.14 volts at its "positive" input and a scaled voltage at node 301.1 of 1.14 volts at its "negative" input. Because the voltage at the "positive" input is greater than the voltage at the "negative" input, comparator output 312.1 will be a logic "1." From FIG. 4A, it is seen that shifting control signal 410 from inverter 402 will be a logic "1" and that AGC control signal 412 from OR gate 404 will be a logic "1." Therefore, AND gate 406 will receive two logic "1"s and will output a logic "1." Thus, amplifier control signal 206.1 will be a logic "1." Amplifier control signal 206.1 is connected to amplifier circuit assembly 502.1. Because amplifier control signal 206.1 is a logic "1," amplifier circuit assembly 502.1 will be "on," and will amplify cable TV signal 110. Since comparator output 312.1 is a logic "1," shifting signal 310.1 is also a logic "1." As can be seen in FIG. 3B, shifting signal 310.1 is routed to logic circuit 308.11, which is illustrated in FIG. 4B.

Inverter 402 receives shifting signal 310.1 from node B. Since shifting signal 310.1 is a logic "1," shifting control signal 410 will be a logic "0." Because automatic gain control voltage 300 is larger than the voltage at node 301.1, it will also be larger than the voltages at nodes 301.2 through 301.35, and comparator outputs 312.2 through 312.35 will all be a logic "1." Thus, OR gate 404 will receive a logic "1" from node A, and will output AGC control signal 412 as a logic "1." AND gate 406 will receive AGC control signal 412 as a logic "1" and shifting control signal as a logic "0," thereby outputting amplifier control signal 206.11 as a logic "0." Recall that amplifier control signal 206.11 is connected to amplifier circuit assembly 502.11. Since amplifier control signal 206.11 is a logic "0," amplifier circuit assembly 502.11 will be "off" and will not amplify the scaled-down cable TV signal present at amplifier input node 501.11. Looking back to FIG. 4B, it can be seen that shifting signal 310.11 will be a logic "1." Shifting signal 310.11 is routed to logic circuit 308.21, also illustrated in FIG. 4B. Since shifting signal 310.11 is a logic "1," shifting control signal 410 will be a logic "0" and amplifier control signal 206.21 from AND gate 406 will be a logic "0" and amplifier circuit assembly 502.21 will be "off" and will not amplify the scaled-down cable TV signal present at node 501.21. Further, since comparator output 312.21 is a logic "1," shifting signal 310.21 is also a logic "1."

Shifting signal 310.21 is routed to logic circuit 308.31 where inverter 402 will output shifting control signal 410 as a logic "0." As a result, AND gate 406 will output amplifier control signal 206.31 as a logic "0" and amplifier circuit assembly 502.31 will be "off" and will not amplify the scaled-down cable TV signal present at node 501.31. Looking to FIG. 4C, it can be seen that shifting signal 310.31 is not connected.

Thus, for the example wherein automatic gain control voltage 300 is larger than the scaled voltage at node 301.1, amplifier circuit assembly 502.1 will be "on," and amplifier circuit assemblies 502.11, 502.21, and 502.31 will be "off." Further, a similar analysis will reveal that amplifier circuit assemblies 501.2 through 501.10 will also be "on" while amplifier circuit assemblies 501.12 through 501.20, 501.22 through 502.30, and 502.32 through 502.35 will all be "off." This is the maximum amplification condition. In other words, at the maximum gain setting, the first 10 amplifiers are "on" and all the other amplifiers are "off".

When the amplitude of amplified signal 112 increases, automatic gain control voltage 300 decreases. If, for example, and not meant to be limiting, automatic gain control voltage 300 decreases to 1.05 volts, FIG. 7 shows that this voltage is lower than the exemplary scaled voltages at nodes 301.1 through 301.25, but is higher than the exemplary scale d voltage at nodes 301.26 through 301.35. Because automatic gain control voltage 300 is lower than the scaled voltage at nodes 301.1 through 301.25, the comparator outputs 312.1 through 312.25 of high-gain, low frequency amplifiers 306.1 through 306.25, respectively, will each be a logic "0." Each amplifier control signal 206.1 through 206.25 from logic circuits 308.1 through 308.25, respectively, will be a logic "0" and consequently amplifier circuit assemblies 502.1 through 502.25 will be "off" and will not amplify cable TV signal 110 nor scaled-down cable TV signal present at nodes 501.1 through 501.25. Each amplifier control signal 206.26 through 206.35 from logic circuits 308.26 through 308.35, respectively, will be a logic "1" and consequently amplifier circuit assemblies 502.26 through 502.35 will be "on" and will amplify scaled-down cable TV signal present at nodes 501.26 through 501.35. Further, each shifting signal 310.1 through 310.25 will be a logic "0" and is routed to logic circuits 308.11 through 308.35, respectively. Each shifting signal 310.26 through 310.35 will be a logic "1," but recall from FIGS. 4C and 4D that shifting signals 310.26 through 310.35 are not connected. Thus, when the automatic gain control voltage is 1.05 volts, amplifier circuit assemblies 502.1 through 502.25 will be "off" and amplifier circuit assemblies 502.26 through 502.35 will be "on."

When the amplitude of amplified signal 112 increases further, automatic gain control voltage 300 decreases further. If, for example, and not meant to be limiting, automatic gain control voltage 300 decreases to 0.65 volts, FIG. 7 shows that this voltage is lower than the exemplary scaled voltages at nodes 301.1 through 301.30, but is higher than the exemplary scaled voltage at nodes 301.31 through 301.35. Because automatic gain control voltage 300 is lower than the scaled voltage at nodes 301.1 through 301.30, the comparator outputs 312.1 through 312.30 of high-gain, low frequency amplifiers 306.1 through 306.30, respectively, will each be a logic "0." Each amplifier control signal 206.1 through 206.30 from logic circuits 308.1 through 308.30, respectively, will be a logic "0" and consequently amplifier circuit assemblies 502.1 through 502.30 will be "off" and will not amplify cable TV signal 110 nor scaled-down cable TV signal present at nodes 501.1 through 501.30. Each amplifier control signal 206.31 through 206.35 from logic circuits 308.31 through 308.35, respectively, will be a logic "1" and consequently amplifier circuit assemblies 502.31 through 502.35 will be "on" and will amplify scaled-down cable TV signal present at nodes 501.31 through 501.35. Further, each shifting signal 310.1 through 310.30 will be a logic "0." Shifting signals 310.1 through 310.25 will be routed to logic circuits 308.11 through 308.35, respectively, and shifting signals 310.26 through 310.30 are not connected. Each shifting signal 310.31 through 310.35 will be a logic "1," but recall from FIGS. 4C and 4D that shifting signals 310.31 through 310.35 are not connected. Thus, when the automatic gain control voltage is 0.65 volts, amplifier circuit assemblies 502.1 through 502.30 will be "off" and amplifier circuit assemblies 502.31 through 502.35 will be "on."

When the amplitude of amplified signal 112 increases further, automatic gain control voltage 300 decreases further. If, for example, and not meant to be limiting, automatic gain control voltage 300 decreases to 0.35 volts, FIG. 7 shows that this voltage is lower than the exemplary scaled voltages at nodes 301.1 through 301.34, but is higher than the exemplary scaled voltage at node 301.35. Because automatic gain control voltage 300 is lower than the scaled voltage at nodes 301.1 through 301.34, the comparator outputs 312.1 through 312.34 of high-gain, low frequency amplifiers 306.1 through 306.34, respectively, will each be a logic "0." Each amplifier control signal 206.1 through 206.32 from logic circuits 308.1 through 308.32, respectively, will be a logic "0" and consequently amplifier circuit assemblies 502.1 through 502.32 will be "off" and will not amplify cable TV signal 110 nor scaled-down cable TV signal present at nodes 501.1 through 501.32. Recall, from FIG. 4D, that nodes C at each of logic circuits 308.33, 308.34, and 308.35 are not connected, and as a result, AGC control signal 412 will be a logic "1," even if comparator output 312.33 and 312.34 are at logic "0."

Since all comparator outputs 312.1 through 312.34 are at logic "0," so too are shifting signals 310.1 through 310.34. Thus, shifting signal 310.23, 310.24, and 310.25 are received at nodes B of logic circuits 308.33, 308.34, and 308.35 and are inverted to logic "1" by inverter 402 and routed to AND gate 406. Thus, AND gate 406 of logic circuits 308.33, 308.34, and 308.35 will output amplifier control signals 206.33, 206.34, and 206.35 as a logic "1." Since each amplifier control signal 206.33 through 206.35 from logic circuits 308.33 through 308.35, respectively, will be a logic "1," consequently amplifier circuit assemblies 502.33 through 502.35 will be "on" and will amplify scaled-down cable TV signal present at nodes 501.33 through 501.35. Further, each shifting signal 310.1 through 310.34 will be a logic "0." Shifting signals 310.1 through 310.25 will be routed to logic circuits 308.11 through 308.35, respectively, and shifting signals 310.26 through 310.34 are not connected. Shifting signal 310.35 will be a logic "1," but recall from FIG. 4D that shifting signal 310.35 is not connected. Thus, when the automatic gain control voltage 300 is 0.35 volts, amplifier circuit assemblies 502.1 through 502.32 will be "off" and amplifier circuit assemblies 502.33 through 502.35 will be "on."

In an alternate embodiment, node C of logic circuit 308.33 is connected to ground, and since AGC voltage is less than the scaled down reference voltage at node 301.33, OR gate 404 of logic circuit 308.33 will receive a logic "0" at both ports, and will output AGC control signal 412 as a logic "0." Thus, AND gate 406 will output amplifier control signal 206.33 as a logic "0" and amplifier circuit assembly 502.33 will be "off" and will not amplify the scaled-down cable TV signal present at node 501.33. In this alternate embodiment, if automatic gain control voltage 300 is 0.35 volts, amplifier circuit assemblies 502.1 through 502.33 will be "off" and amplifier circuit assemblies 502.34 and 502.35 will be "on."

In yet another alternate embodiment, node C of logic circuits 308.33 and 308.34 are connected to ground, and since AGC voltage is less than the scaled down reference voltage at nodes 301.33 and 301.34, OR gate 404 of logic circuits 308.33 and 308.34 will receive a logic "0" at both ports, and will output AGC control signal 412 as a logic "0." Thus, AND gate 406 will output amplifier control signals 206.33 and 206.34 as a logic "0" and amplifier circuit assemblies 502.33 and 502.35 will be "off" and will not amplify the scaled-down cable TV signal present at nodes 501.33 and 501.34. In this alternate embodiment, if automatic gain control voltage 300 is 0.35 volts, amplifier circuit assemblies 502.1 through 502.34 will be "off" and only amplifier circuit assembly 502.35 will be "on." Further, even if the value of automatic gain control voltage 300 drops below the scaled down reference voltage at node 301.35, amplifier circuit assembly 502.35 will always be "on."

As discussed herein and as illustrated FIGS. 3C–3E, each amplifier circuit 502 turns on and off "smoothly" over the linear region $\Delta V_{IN}$. In other words, when the internal AGC voltage 300 is relative close (e.g. within 10 mV) to the node 301 voltage, the respective amplifier 502 will operate in linear fashion as shown in FIG. 3E. Outside the linear region $\Delta V_{IN}$, the gain of amplifier 502 is either at maximum gain or zero gain, as shown.

Figure 11:
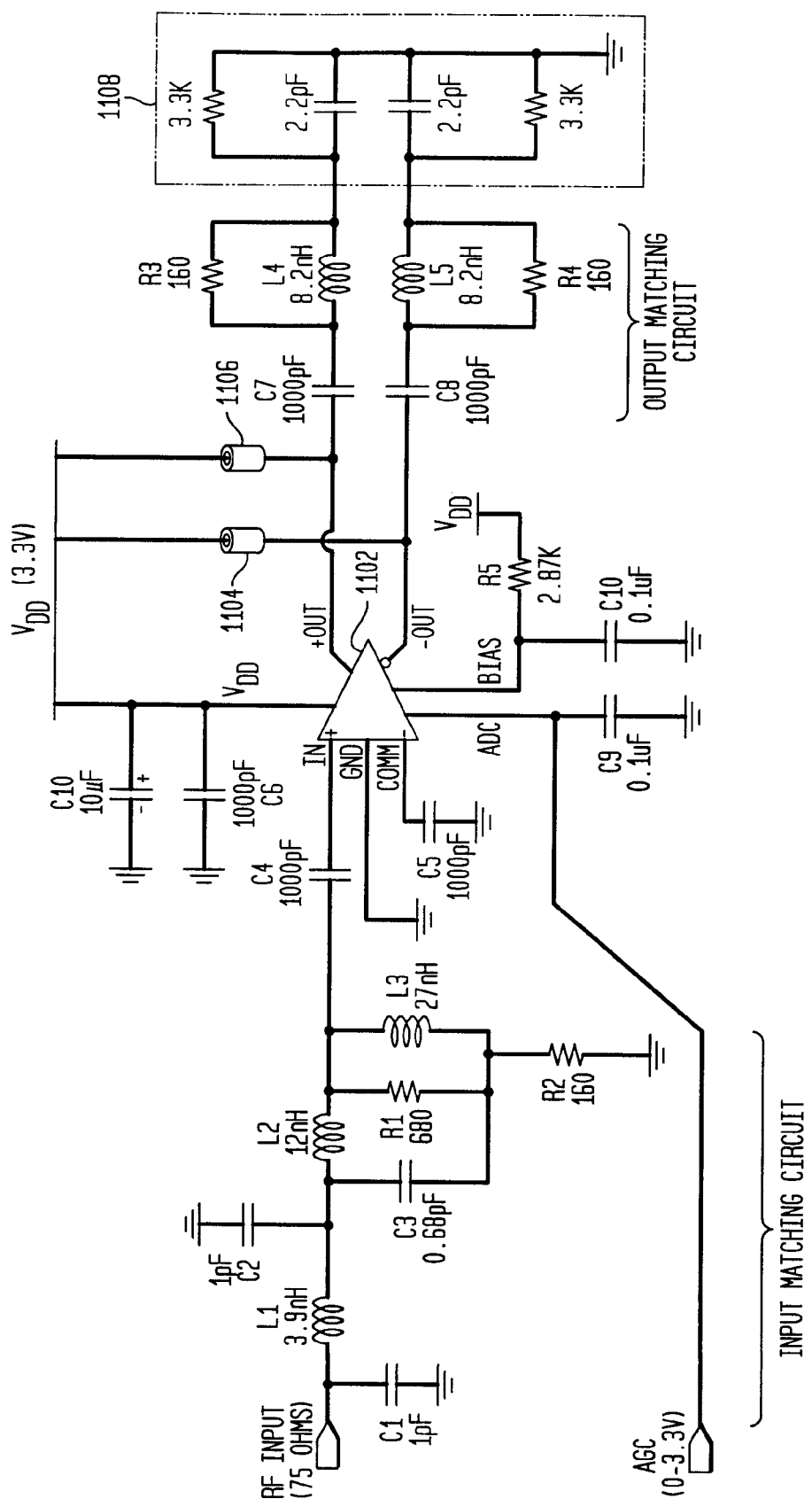
FIG. 11 illustrates an exemplary amplifier circuit.

The amplifier will use inductive and capacitive peaking circuits at its input and output for even greater bandwidth. Such matching circuits are required because of the topology of the amplifier (35 stages), the fact that the amplifier has been designed in a low-cost CMOS process, and the need to drive a fairly capacitive load. All this results in a bit too much capacitance on the input and output of the amplifier to prevent loss of gain at high frequency. The input matching network of FIG. 11 is a combination of a modified T-coil with series peaking. Values shown are for illustrative purposes only and are not limiting. In general, an amplifier 1102 is connected to a diplexer circuit (a combination of high-pass-filter for the downstream, and a low-pass-filter connected to the upstream power amplifier). Occasionally, the diplexer circuit has an excess of inductance, which allows C1 and L1 to be omitted. The T-coil used does not include any mutual inductance (i.e coupling) between L2 and L3 (but it could if desired). Such mutual coupling would improve bandwidth and input match, but is generally tough to do with surface-mount components. Note that the input matching circuit maintains gain flatness and good input match. Inductors L4 and L5 peak out the parasitic capacitance from a tuner 1108. Resistors R3 and R4 make sure the frequency response remains flat across the operating band. If the signal is peaked between amplifier 1102 and tuner 1108, distortion will result. All inductors are small (low inductance value) and can be printed on the PCB to save cost. The bias resistor, R5, can be grounded (instead of being connected to $V_{DD}$) to power down the chip. Off-chip ferrite beads 1104 and 1106 are also illustrated. Ferrite beads 1104 and 1106 each have an equivalent circuit that is parallel L-R circuit. At high frequency, each ferrite bead looks like a large resistor, and at low frequency each ferrite bead looks like a short circuit.

In order to accommodate a large range of values for automatic gain control voltage 114, a voltage divider for different sensitivities is illustrated as sensitivity circuit 802 in FIG. 8. Sensitivity circuit 802 operates as a voltage divider and is preferably located with automatic gain control logic decoder 204. Sensitivity circuit 802 is comprised of a plurality of resistors as illustrated in FIG. 8. Sensitivity circuit 802 further is comprised of three input pads 804, 806, and 808, and the output 300, which is the (internal) AGC voltage 300 in FIG. 3B. The user of VGA 104 may choose to connect automatic gain control voltage 114 to either pin 804, 806, or 808. However, pin 804 is preferred. Output 300 is then used as the input to resistor ladder 302 of FIG. 3. By using sensitivity circuit 802, the voltage range of automatic gain control voltage 114 need not be confined to the maximum voltage of the amplifier array. Thus, automatic gain control voltage 114 as generated by demodulator 106 could have a range between 0.3 and 3 volts, and sensitivity circuit 802 will scale it so that resistor ladder 302 will see respective voltages of 0.4 and 1.14 volts. In an embodiment, R3 is 53 KΩ, R4 is 8 KΩ, R5 is 10.67 KΩ, and R6 is 8 KΩ, although the invention is not restricted to these values. Optional capacitor 810 is added to reduce noise on the output.

To address the issue of impedance matching in amplifier array 202, a further feature of the invention is the inclusion of a small feed-forward capacitor in amplifier resistor ladder 503. Looking back to FIG. 5, it would be advantageous to include a capacitor across each resistor 514.11 through 514.35. However, space constraints prevent this from being a realistic option. Therefore, a single capacitor 514 may be connected from amplifier input node 501.12 to amplifier input node 501.33. The location of the capacitor 514 can be varied up or down the resistor ladder to tune the impedance matching. An exemplary value for this capacitor is 1 picoFarad, although the invention is not limited to this.

Figure 9:
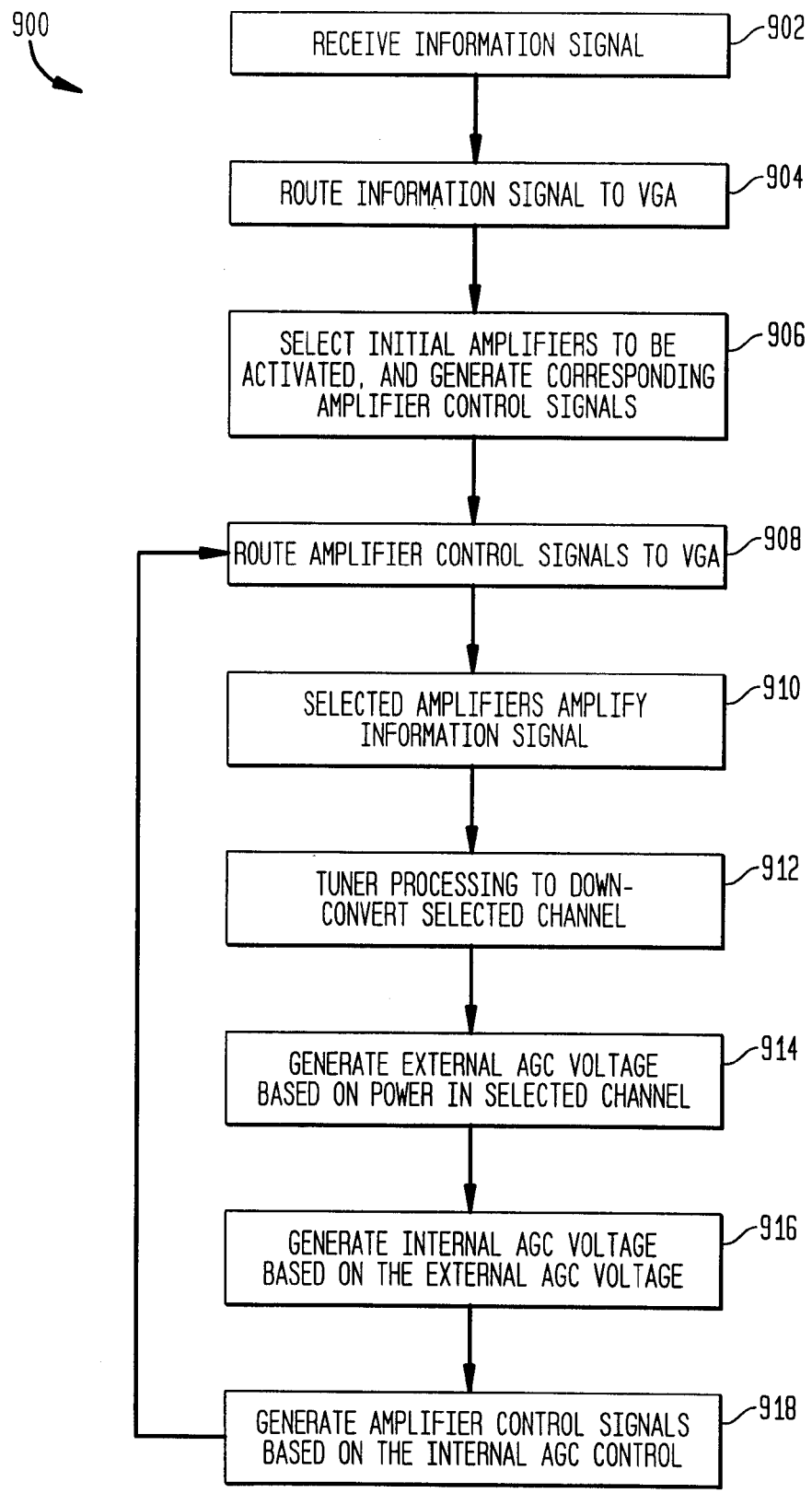
FIG. 9 illustrates a method of varying the gain of an information signal.
Figure 10:
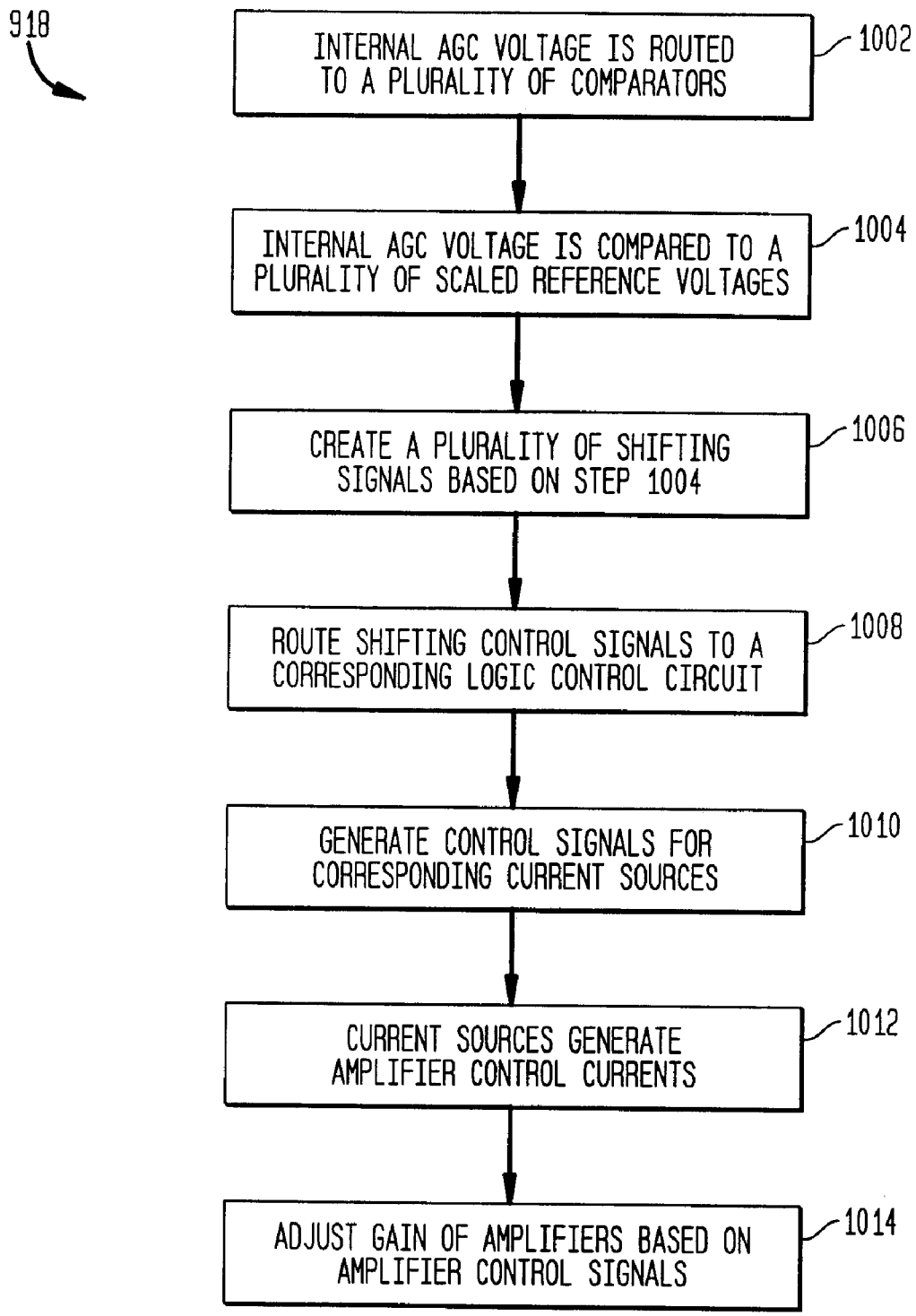
FIG. 10 illustrates a method of generating an amplifier control signal.

An exemplary method for carrying out the invention is illustrated in FIG. 9 and FIG. 10. Looking first to FIG. 9, a method 900 for varying the gain of an information signal is shown. In step 902, an information signal is received, such as a CATV signal from cable 102. In step 904, the information signal is routed to a variable gain amplifier (VGA), such as for example VGA 104. As shown in FIG. 1, the information signal can be routed through a diplexer, such as diplexer 103. Step 906 illustrates the initial set-up of a variable gain amplifier, wherein a set of amplifier control are selected to be activated using amplifier control signals when the method begins. Herein, an activated amplifier includes the linear gain region shown in FIG. 3E, where appropriate. One skilled in the relevant art(s) will understand that there are several ways to establish which amplifiers are selected for the initial start-up. Some of these are, without limitation, selecting a set of the highest gain amplifiers, selecting a set of the lowest gain amplifiers, or selecting a set of amplifiers in the middle range. In step 908, amplifier control signals are routed to the VGA. In step 910, selected amplifiers amplify either the information signal or the scaled down information signal present, as appropriate. In step 912, the amplified signal could be optionally further processed, such as for example by the tuner 105 to output a selected channel. In step 914, an external automatic gain control (AGC) signal is generated by examining the power in the selected channel. For example the external AGC voltage 114 is generated by the demodulator 106. If the power is not as high as one would want, the external AGC voltage will be such that higher gain amplifiers will be "activated." (i.e. turned "on") As stated herein, "activation" includes the smooth linear region $\Delta V_{IN}$ of FIGS. 3C–3E. On the other hand, if the amplified signal is too high, the AGC voltage will be such that the higher gain amplifiers have their gain reduced (during the smooth linear region $\Delta V_{IN}$) or are turned "off," and the lower gain amplifiers are activated. In step 916, an internal AGC voltage is generated based on the external AGC voltage. For example, internal AGC voltage 300 is created from external AGC voltage 114 by the voltage divider 802 in FIG. 8. In step 918, the amplifier control signals are generated, based on the internal AGC voltage. The amplifier control signals are then fed back to step 905 to control the amplifiers. Step 918 is further described in FIG. 10.

The step of generating the amplifier control signals (step 918 of FIG. 9) is illustrated in FIG. 10. In step 1002, the internal AGC voltage from step 918 is routed to one or more comparators, such as, without limitation, comparators 306. In step 1004, the internal AGC voltage is compared to a plurality of scaled reference voltages, such as the reference voltages at nodes 301 (FIG. 3B). The result of this comparison is seen in step 1006, wherein a plurality of shifting signals are generated, such as comparator output signals 312 (FIG. 3B). If the internal AGC voltage is higher than the scaled reference voltage, a logic "1" is generated, but subject to the smooth linear region $\Delta V_{IN}$ shown in FIG. 3C. If the internal AGC voltage is higher than the scaled reference voltage, a logic "0" is generated, but again subject to the smooth linear region $\Delta V_{IN}$. Instep 1008, each of the shifting signals is routed to a logic control circuit, such as logic control circuits 308 in FIG. 3B. In step 1010, each logic control circuit generates an output signal to control a corresponding current source, such as current sources 311 in FIG. 3B. In step 1012, each current sources 311 generates an amplifier control current, such as amplifier control currents 206. The control currents 206 are smoothly varied over the linear region $\Delta V_{IN}$, but are saturated or zero outside this region as shown in FIG. 3D. In step 1014, control currents 206 adjust the gain of an "down-stream" amplifiers, such as amplifiers 502 (FIG. 5). The gain of each amplifier 502 is smoothly adjusted over the linear region $\Delta V_{IN}$, but is saturated or zero outside this region. When the gain is saturated then the amplifier is turned completely "on" and when the gain is zero then the amplifier is turned completely "off". In one embodiment, if amplifier number 1 is "on," then amplifier number 11 will receive a control signal that will cause it to be "off," and if amplifier number 1 is "off," then amplifier number 11 will receive a shifting signal that will cause it to be "on."

The shifting signals and amplifier control are described further as follows. Some shifting signals are routed to other appropriate logic circuit. In other words, each logic circuit creates a shifting signal, but not every logic signal receives a shifting signal. By way of example, logic circuits number 1 through number 10 create shifting signals that are routed to logic circuits number 11 through number 20, respectively, but they, themselves (i.e., logic circuits number 1 through number 10), do not receive shifting signals. Further, the final ten logic circuits (e.g., logic circuits number 26 through number 35, in an exemplary embodiment wherein there are 35 amplifiers and a corresponding 35 logic circuits) receive shifting signal from previous logic circuits (e.g., logic circuits number 16 through number 25). In one implementation, these logic circuits (number 26 through number 35) create shifting signals that are then left unconnected. In an alternate implementation, these logic circuits do not create shifting signals.

Each logic control circuit operates to create an amplifier control signal. As an example, logic circuit number 15 will receive AGC control signal number 15 and shifting signal number 5 to create amplifier control signal 15. The amplifier control signal operates to turn a corresponding amplifier "on" or "off", subject to the smooth linear region. Each amplifier control signal is routed to a corresponding amplifier.

As a summary of the process, when amplifiers #1 through #10 are "on," amplifiers #11 through #35 are "off." When the signal needs to be attenuated (i.e., does not need as much amplification), amplifiers beginning with amplifier #1 are switched "off" and other amplifiers beginning with amplifier #11 are switched "on." When amplifiers #1 through #10 are switched "off," amplifiers #11 through #20 will be "on." If further attenuation is needed, amplifier #11 will be switched "off," and amplifier #21 will be switched "on." This continues until the remaining amplifiers left "on" are amplifiers #26 through #35. If more attenuation is needed, amplifier #26 will be switched "off," but no additional amplifiers will be switched "on." Thus, only 9 amplifiers will be "on." This process continues until only three amplifiers are left "on." In a first embodiment, the minimum number of amplifiers to be left "on" is 3. In a second embodiment, the minimum number of amplifiers to be left "on" is 2. In a third embodiment, the minimum number of amplifiers to be left "on" is 1.

In summary, the invention thus described herein comprises an extended range variable gain amplifier which uses an array of 35 differential pair amplifiers. In a preferred embodiment, amplifiers #1 through #10 are "on." These first 10 amplifiers have unattenuated inputs. As an automatic gain control voltage indicates that less amplification is needed (i.e., the output signal needs to be attenuated), the amplifier #1 is turned "off" and amplifier #11 is turned "on." The input to amplifier #11 is attenuated. This swapping of amplifiers continues until only amplifiers #26 through #35 are "on." At this point, if additional attenuation is needed, amplifiers are sequentially switched "off," but no additional amplifiers are switched "on." When only three amplifiers remain, i.e., #33 through #35, the switching "off" stops. When less attenuation is needed (i.e., more amplification is required), the reverse process applies.

Conclusion

Benefits of the invention are, at least, and by way of example and not limitation, the following:

More bandwidth (i.e. better higher frequency performance) due to using less stages and external peaking circuits than in previous designs.

Low distortion, especially for large composite channel signals found in cable TV. This is due to connecting the amplifier outputs to $V_{DD}$ via external inductors or ferrites and due to using a resistor attenuator at the front end.

Only enough gain reduction is done at the input to make sure the largest input signal condition is met. This allows use of fewer stages. The rest of the gain reduction is done by turning off stages (essentially gain reduction at the output).

Low noise figure.

Good input match (even at different gain settings)

Minimized distortion as the gain is changed. This is accomplished by carefully controlling the logic circuit transitions as the AGC voltage is changed. This is also ensured by fully turning off all unused stages. Previous logic stages did not fully turn off each stage, resulting in excessive distortion at low gain (high attenuation settings).

Power consumption is lowered as sequential gain stages are turned off

Noise figure degradation vs. gain reduction is less than 1:1 for lower gain settings, since attenuation comes at the output after the first 18 dB (done by turning off stages). This is important when the input signal level is high.

Internal voltage divider for better AGC range control, with bond options.

Single-ended input which eliminates the need for an external balun.

Power and performance can be controlled with a single external resistor. Making the bias resistor larger can reduce power by a factor of 2 with little degradation in gain, noise figure and distortion. Grounding the bias resistor functions as a means to power-down the chip.

Gain remains flat over full bandwidth and attenuation range, due to internal peaking capacitor across resistor ladder.

Increased AGC control range: More than 30 dB at 860 MHz and more than 35 dB at lower frequencies.

At a minimum, application is to cable modems, set-top box receivers and analog TV tuners.

Gain is controlled by a combination of selecting amplifiers connected to a tapped resistor ladder and by turning off stages.

Chip has been designed to use low-cost digital CMOS process. However this is not a limitation as other semiconductor processes could be used including bipolar or GaAs MESFET.

The number of signal amplifier stages is reduced, and therefore the bandwidth of the amplifier array is increased because each amplifier stage has a parasitic capacitance.

While various embodiments of the present invention have been described above, it should be understood that they have been presented by way of example only, and not limitation. For example, while the invention has been described in terms of particular quantity of amplifiers, one skilled in the art would recognize that the instant invention could be applied to a larger or smaller set of amplifiers. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the claims and their equivalents.

What is claimed is:

1. A method of varying the gain of an amplifier, wherein the amplifier is comprised of an amplifier array and an automatic gain control (AGC) logic decoder, wherein the amplifier array is further comprised of "n" amplifier circuit assemblies, where "n" is a positive integer, wherein an "$i^{th}$" amplifier circuit assembly of the "n" amplifier circuit assemblies has an information input, a control input and one or more amplifier outputs, and the AGC logic decoder is further comprised of "n" AGC amplifiers and "n" logic circuits, wherein an $i^{th}$ AGC amplifier of the "n" AGC amplifiers has two or more inputs and one or more outputs, each output being an AGC control signal, and an $i^{th}$ logic circuit of the "n" logic circuits has one or more logic inputs and one or more logic outputs, wherein a first logic output is an amplifier control signal and a second logic output is a shifting signal;

the method comprising the steps of:

(1) routing an AGC signal to a first input of the $i^{th}$ AGC amplifier;

(2) comparing said AGC signal to an $i^{th}$ scaled reference voltage, said $i^{th}$ scaled reference voltage being received at a second input of the $i^{th}$ AGC amplifier for all i between 1 and (n−q), inclusive, where q is a positive integer less than n;

(3) for all "i" between 1 and (n−q), inclusive, generating an $i^{th}$ AGC control signal from the $i^{th}$ AGC amplifier, wherein the $i^{th}$ AGC control signal is a first logic level if said AGC signal is greater than said $i^{th}$ scaled reference voltage, and is a second logic level if said AGC signal is less than said $i^{th}$ scaled reference voltage;

(4) for all "i" between (n−q+1) and "n", inclusive, generating an $i^{th}$ AGC control signal from the $i^{th}$ AGC amplifier, wherein the $i^{th}$ AGC control signal is at said first logic level;

(5) routing said $i^{th}$ AGC control signal to a first logic input of the $i^{th}$ logic circuit;

(6) generating, in the $i^{th}$ logic circuit, the $i^{th}$ shifting signal;

(7) for all "i" between 1 and "m", inclusive, where "m" is a positive integer less than "n", routing the $i^{th}$ shifting signal to a second logic input of the "$j^{th}$" logic circuit, where j=i+p where p is a positive integer equal to (n−m);

(8) generating, in the $i^{th}$ logic circuit, the $i^{th}$ amplifier control signal, wherein the $i^{th}$ amplifier control signal is a first control level when the $i^{th}$ amplifier circuit assembly is to be turned "on", and is a second control level when the $i^{th}$ amplifier circuit assembly is to be turned "off";

(9) routing the $i^{th}$ amplifier control signal to the control input of the $i^{th}$ amplifier circuit assembly;

(10) for all "i" between 1 and "p", inclusive, accepting, at the information input of the $i^{th}$ amplifier circuit, an input signal;

(11) for all "i" between (p+1) and "n", inclusive, accepting, at the information input of the $i^{th}$ amplifier circuit, an $i^{th}$ attenuated input signal;

(12) for all "i" between 1 and "p", inclusive, amplifying said input signal when the $i^{th}$ amplifier control signal is at said first control level, thereby creating an $i^{th}$ amplified signal;

(13) for all "i" between (p+1) and "n", inclusive, amplifying said attenuated input signal when the $i^{th}$ amplifier control signal is at said first control level, thereby creating an $i^{th}$ amplified signal; and

(14) outputting, from the amplifier output of the $i^{th}$ amplifier circuit, an $i^{th}$ amplifier output signal, wherein said $i^{th}$ amplifier output signal is said $i^{th}$ amplified signal when the $i^{th}$ amplifier control signal is at said first control level, and is a null signal when the $i^{th}$ amplifier control signal is at said second control level.

2. The method of claim 1, further comprising the steps of:

(15) for all "i" between 1 and "n", inclusive, combining all said $i^{th}$ amplifier output signals, thereby creating a combined amplified signal; and

(16) determining, from said combined amplified signal, said AGC signal.

3. The method of claim 2, further comprising the step of:

(17) demodulating said combined amplified signal.

4. The method of claim 1, wherein "n" is 35.

5. The method of claim 4, wherein "m" is 25 and "p" is 10.

6. The method of claim 4, wherein "q" is 3.

7. The method of claim 4, wherein "q" is 2.

8. The method of claim 4, wherein "q" is 1.

9. The method of claim 1, wherein said first logic level is a logic "1" and said second logic level is a logic "0".

10. The method of claim 1, wherein said first control level is a logic "1" and said second control level is a logic "0".

11. The method of claim 1, wherein said input signal is a cable TV signal.

12. The method of claim 1, wherein said input signal is routed to a resistor ladder, the resistor ladder having "m" nodes, wherein, for "i" between (p+1) and "n", inclusive, at an $i^{th}$ node said input signal has been attenuated to be said $i^{th}$ attenuated input signal.

13. A system for controlling the gain of an amplifier, comprising:

(a) a plurality of automatic gain control (AGC) amplifiers, a corresponding plurality of logic circuits, and a corresponding plurality of amplifier circuit assemblies; wherein:

(b) each of said plurality of AGC amplifiers has a first AGC input accepting an AGC signal; each of said plurality of AGC amplifiers has a second AGC input accepting a comparison signal; and each of said plurality of AGC amplifiers has an AGC output outputting an AGC control signal, said AGC control signal being at a first logic level when said AGC signal is equal to or greater than said corresponding comparison signal, and being at a second logic level when said AGC signal is less than said corresponding comparison signal, (i) wherein, for AGC amplifier number 1 through AGC amplifier number (n−q), inclusive, said comparison signal is a scaled reference voltage wherein the scaled reference voltage at the $i^{th}$ AGC amplifier is greater than the scaled reference voltage at the (i+1)th AGC amplifier, where "n" is a positive integer greater than 10, and "q" is a positive integer less than "n", and (ii) for AGC amplifier number (n−q+1) through AGC amplifier number "n", inclusive, said comparison signal is an electrical ground;

(c) each of said plurality of logic circuits has a first logic input accepting said AGC control signal; logic circuit number (p+1) through logic circuit number "n", inclusive, has a second logic input accepting an input logic shifting signal; each of said plurality of logic circuits has a first logic output outputting an output logic shifting signal, wherein said output logic shifting signal from logic circuit number 1 through logic circuit number (n−p), inclusive, is said input logic shifting signal for logic circuit number (p+1) through logic circuit number "n", inclusive, respectively; and each of said plurality of logic circuits has a second logic output outputting an amplifier control signal, wherein said amplifier control signal is at a first control level when said amplifier circuit assembly corresponding to said logic circuit is to be turned "on", and at a second control level when said amplifier circuit assembly corresponding to said logic circuit is to be turned "off", such that no more than "p" amplifier control signals are to be at said first control level at any time, wherein "p" is a positive integer less than "n";

(d) each of said plurality of amplifier circuit assemblies has a control input accepting a corresponding amplifier control signal; each of said plurality of amplifier circuit assemblies has a signal input, wherein, for amplifier circuit assembly number 1 through amplifier circuit assembly number "p", inclusive, said signal input accepts an information signal, and for amplifier circuit assembly number (p+1) through amplifier circuit assembly number "n", inclusive, said signal input accepts an attenuated information signal, wherein attenuated information signal "i" is less attenuated than attenuated information signal (i+1); and each of said plurality of amplifier circuit assemblies has an amplified output, wherein, for every amplifier circuit assembly receiving an amplifier control signal at said first control level, said amplifier output is an amplified signal, and for every amplifier circuit assembly receiving an amplifier control signal at said second control level, said amplifier output is a null signal; and (e) each said amplified output is combined to form a combined amplified signal.

14. The system of claim 13, wherein said combined amplified signal is evaluated, thereby generating said AGC signal.

15. The system of claim 13, wherein said combined amplified signal is demodulated, creating a demodulated signal.

16. The system of claim 13, wherein "n" is equal to 35.

17. The system of claim 16, wherein "p" is equal to 10.

18. The system of claim 16, wherein "q" is equal to 3.

19. The system of claim 16, wherein "q" is equal to 2.

20. The system of claim 16, wherein "q" is equal to 1.

21. The system of claim 13, wherein said first logic level is a logic "1" and said second logic level is a logic "0".

22. The system of claim 13, wherein said first control level is a logic "1" and said second control level is a logic "0".

23. An amplifier array, comprising:
an input node;
a first set of amplifiers, arranged in a parallel fashion, and having their inputs tied together at said input node;
a resistor ladder coupled between said input node and ground; and
a second set of amplifiers, having their inputs tied to corresponding taps on said resistor ladder;
wherein outputs of said first set of amplifiers and outputs of said second set of amplifier are summed together at an output the amplifier array;
wherein gain for the amplifier array is adjusted by sequentially turning off one or more amplifiers in said first set of amplifiers, and sequentially turning on one or more amplifiers in said second set of amplifiers that correspond to said one or more amplifiers in said first set of amplifiers that are turned off.

24. The amplifier array of claim 23, wherein once all of said amplifiers in said first set of amplifiers are turned off, the gain of the amplifier array is further adjusted by sequentially turning off one or more amplifiers in said second set of amplifiers.

25. The amplifier array of claim 23, further comprising at least one ferrite bead between coupled between said output of the amplifier array and a DC supply.

26. The amplifier array of claim 23, further comprising a capacitor coupled across one or more taps of said resistor ladder.

27. The amplifier array of claim 26, wherein said capacitor flattens the gain of said amplifier array over one or more attenuation settings.

28. The amplifier array of claim 23, further comprising a plurality of capacitors coupled across corresponding taps of said resistor ladder.

29. The amplifier array of claim 23, further comprising a plurality of comparators that correspond to each of said amplifiers in said first set of amplifiers and said second set of amplifiers, wherein each comparator compares a first voltage with a second voltage, resulting in a amplifier control signal that controls said corresponding amplifier in the amplifier array.

30. The amplifier array of claim 29, wherein said control signal turns on said corresponding amplifier when said first voltage is greater than said second voltage.

31. The amplifier array of claim 29, wherein said control signal turns off said corresponding amplifier when said second voltage is greater than said first voltage.

32. The amplifier array of 29, wherein said amplifier control signal causes said corresponding amplifier to operate linearly when a difference between said first voltage and said second voltage is less than a threshold.

33. The amplifier array of claim 29, further comprising a voltage divider having an input that receives an external automatic gain control voltage (AGC) having a voltage range, wherein said voltage divider compresses said voltage range of said AGC voltage to generate said first voltage.

34. The amplifier array of claim 33, wherein said voltage divider includes a means for adjusting compression of said external AGC voltage.

35. The amplifier array of claim 23, wherein said input node is single-ended.

36. The amplifier array of claim 23, wherein said output of the amplifier array is differential.

37. The amplifier array of claim 23, wherein said first set of amplifiers, said second set of amplifiers, are fabricated using one or more field effect transistors (FETs) process.

38. The amplifier array of claim 37, wherein said field effect transistors are fabricated using a CMOS process.

39. The amplifier array of claim 23, wherein said input node is coupled to a diplexer, and said output is coupled to a tuner.

40. The amplifier array of claim 23, further comprising at least one inductor coupled between said output and a DC supply.

* * * * *